United States Patent
Brew et al.

(10) Patent No.: US 11,610,941 B2
(45) Date of Patent: Mar. 21, 2023

(54) INTEGRATED NON VOLATILE MEMORY ELECTRODE THIN FILM RESISTOR CAP AND ETCH STOP

(71) Applicant: International Business Machines Corporation, Armonk, NY (US)

(72) Inventors: Kevin W. Brew, Niskayuna, NY (US); Takashi Ando, Eastchester, NY (US); Michael Rizzolo, Delmar, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 17/104,169

(22) Filed: Nov. 25, 2020

(65) Prior Publication Data
US 2022/0165790 A1 May 26, 2022

(51) Int. Cl.
*H01L 27/24* (2006.01)
*H01L 27/11507* (2017.01)
*H01L 27/22* (2006.01)

(52) U.S. Cl.
CPC .... *H01L 27/2409* (2013.01); *H01L 27/11507* (2013.01); *H01L 27/224* (2013.01)

(58) Field of Classification Search
CPC ........... H01L 27/2409; H01L 27/11507; H01L 27/224
See application file for complete search history.

(56) References Cited

U.S. PATENT DOCUMENTS

| | | | |
|---|---|---|---|
| 7,995,371 B2 | 8/2011 | Rinerson et al. | |
| 8,681,530 B2 | 3/2014 | Wang et al. | |
| 8,817,524 B2 | 8/2014 | Wang et al. | |
| 8,866,121 B2 | 10/2014 | Wang et al. | |
| 8,975,727 B2 | 3/2015 | Wang et al. | |
| 9,666,243 B2 | 5/2017 | Levisse | |
| 9,837,603 B1 * | 12/2017 | Deshpande | H01L 43/02 |
| 10,163,503 B2 | 12/2018 | Lee et al. | |
| 10,256,272 B2 | 4/2019 | Yoshida et al. | |
| 10,497,752 B1 | 12/2019 | Ando et al. | |
| 2004/0159828 A1 | 8/2004 | Rinerson | |

(Continued)

FOREIGN PATENT DOCUMENTS

CN 101174673 A 5/2008

OTHER PUBLICATIONS

Notification of transmittal of the international search report and the written opinion of the international searching authority, PCT/CN2021/126730, dated Jan. 30, 2022.

*Primary Examiner* — Allison Bernstein
(74) *Attorney, Agent, or Firm* — Matthew Zehrer

(57) ABSTRACT

A non-volatile memory cell includes a thin film resistor (TFR) in series and between a top state influencing electrode and a top wire. The TFR limits or generally reduces the electrical current at the top state influencing electrode from the top wire. As such, non-volatile memory cell endurance may be improved and adverse impacts to component(s) that neighbor the non-volatile memory cell may be limited. The TFR is additionally utilized as an etch stop when forming a top wire trench associated with the fabrication of the top wire. In some non-volatile memory cells where cell symmetry is desired, an additional TFR may be formed between a bottom wire and a bottom state influencing electrode.

16 Claims, 10 Drawing Sheets

(56) References Cited

U.S. PATENT DOCUMENTS

| | | |
|---|---|---|
| 2005/0054119 A1 | 3/2005 | Hsu |
| 2005/0151156 A1 | 7/2005 | Wu |
| 2018/0261649 A1 | 9/2018 | Annunziata et al. |
| 2020/0161373 A1 | 5/2020 | Cheng et al. |

* cited by examiner

INTEGRATED NON VOLATILE MEMORY ELECTRODE THIN FILM RESISTOR CAP AND ETCH STOP

FIELD

Embodiments of the invention relate generally to the field of semiconductor devices and, more particularly, to non-volatile solid-state memory devices.

BACKGROUND

Some advanced node (14 nm or beyond) semiconductor devices may be fabricated utilizing metal hard-mask etching schemes that utilize metal removing wet etchants. Such techniques may be incompatible with solid state non-volatile memory (NVM) cells that use metal top electrodes. Also, these metal top electrodes may be too conductive for optimal or desired NVM device operation. For example, a current-control or current limiting device (e.g. transistor, or the like) may be needed to control filament formation and force current compliance in resistive random access memory (RRAM) cells. In another example, due to rapid negative differential resistance switching or the like, current overshoot may be experienced by NVM cells. This current overshoot can affect NVM cell endurance and may adversely impact component(s) surrounding the NVM cell.

SUMMARY

In an embodiment of the present invention, a non-volatile memory (NVM) is presented. The NVM includes a top state influencing electrode in contact with a state changing structure. The top state influencing electrode effects a detectable property of the state changing structure. The detectable property of the stage changing structure represents a data value stored by the NVM. The NVM further includes a top wire and a first thin film resistor (TFR) between and contacting each of the top state influencing electrode and the top wire.

In another embodiment of the present invention, an integrated circuit (IC) device fabrication method is presented. The method includes forming a bottom state influencing electrode above and in-line with a bottom wire. The method includes forming a state changing structure upon the bottom state influencing electrode. The method further includes forming a top state influencing electrode directly upon the state changing structure. The top state influencing electrode effects a detectable property of the state changing structure. The detectable property of the stage changing structure represents a data value. The method further includes forming a thin film resistor (TFR) directly upon the top state influencing electrode.

In yet another embodiment of the present invention, an integrated circuit (IC) device fabrication method is presented. The method includes forming a bottom thin film resistor (TFR) directly upon a bottom wire. The method further includes forming a bottom state influencing electrode in-line with the bottom wire and directly upon the TFR. The bottom TFR electrically serially connects the bottom wire and the bottom state influencing electrode. The method further includes forming a state changing structure upon the bottom state influencing electrode. The method further includes forming a top state influencing electrode directly upon the state changing structure. The top state influencing electrode effects a detectable property of the state changing structure. The detectable property of the stage changing structure represents a data value. The method further includes forming a top TFR directly upon the top state influencing electrode.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Figure 1:
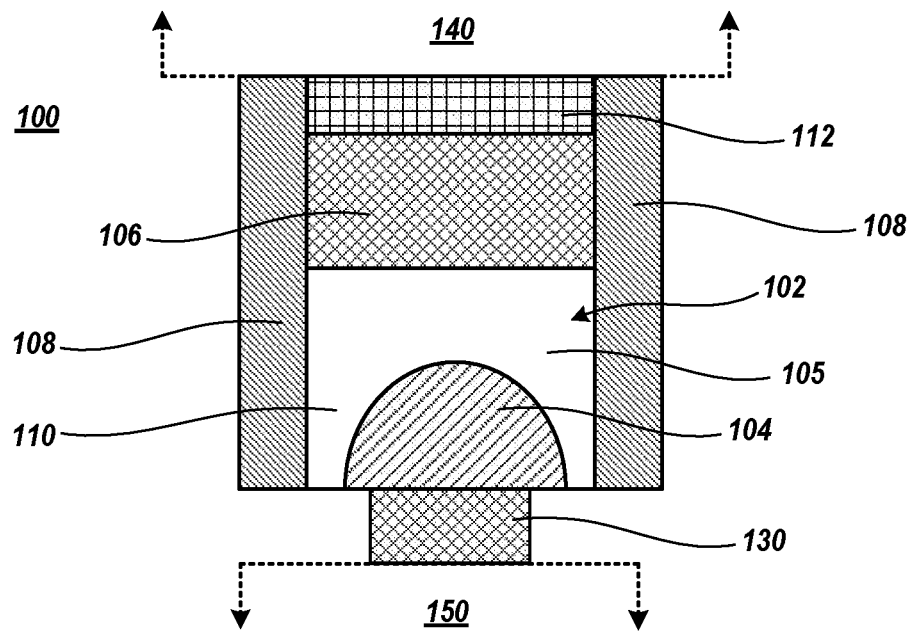
FIG. 1 depicts a cross section of a phase change random access memory (PCRAM) cell that includes an integrated thin film resistor and etch stop, in accordance with various embodiments of the present invention.

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description and drawings, details of well-known features and techniques may be omitted to avoid unnecessarily obscuring the presented embodiments.

Referring to the drawings, wherein like components are labeled with like numerals, exemplary fabrication steps of forming an IC device that includes one or more PCM memory cells 100, are shown and described in greater detail below. It should be noted that while this description may refer to some components of the IC device in the singular tense, more than one component may be included within the IC device. The specific components depicted in the drawings and the cross-section orientation was chosen to best illustrate the various embodiments described herein.

A non-volatile memory cell includes a thin film resistor (TFR) in series and between a top state influencing electrode and a top wire. The TFR limits or generally reduces the electrical current at the top state influencing electrode from the top wire. As such, non-volatile memory cell endurance may be improved and adverse impacts to component(s) that neighbor the non-volatile memory cell may be limited. The TFR is additionally utilized as an etch stop when forming a top wire trench associated with the fabrication of the top wire. In some non-volatile memory cells where cell symmetry is desired, an additional TFR may be formed between a bottom wire and a bottom state influencing electrode. FIG. 1 depicts a cross section of a phase change random access memory (PCRAM) cell that includes an integrated thin film resistor and etch stop, in accordance with various embodiments of the present invention.

FIG. 1 depicts a cross section of PCRAM cell 100 that includes integrated TFR and etch stop 112, herein referred to as TFR 112, in accordance with various embodiments of the present invention.

PCRAM is a non-volatile solid-state memory technology that exploits the reversible, thermally-assisted switching of a phase change material (PCM), in particular chalcogenide compounds such as Germanium-Antimony-Tellurium (GST), between states with different electrical resistance. The fundamental storage unit (the "cell") can be programmed into a number of different states, or levels, which exhibit different resistance characteristics. The programmable cell-states can be used to represent different data values, permitting storage of information.

In PCM devices, each cell can be set to at least 2 states, a "SET" state and a "RESET" state, permitting storage of one bit per cell. In the RESET state, which corresponds to a wholly maximally amorphous state of the phase-change material, the electrical resistance of the cell is very high. By heating to a temperature above its crystallization point and then cooling, the phase-change material can be transformed into a low-resistance, fully-crystalline state. This low-resistance state provides the SET state of the cell. If the cell is then heated to a high temperature, above the melting point of the phase-change material, the material reverts to the fully-amorphous RESET state on rapid cooling. In multi-level PCM devices, the cell can be set to s>2 programmable states permitting storage of more than one bit per cell. The different programmable states correspond to different relative proportions of the amorphous and crystalline phases within the volume of phase-change material. In particular, in addition to the two states used for single-level operation, multilevel cells exploit intermediate states in which the cell contains different volumes of the amorphous phase within the otherwise crystalline PCM. Since the two material phases exhibit a large resistance contrast, varying the size of the amorphous phase within the overall cell volume produces a corresponding variation in cell resistance.

Reading and writing of data in PCM cells is achieved by applying appropriate voltages to the phase-change material via a pair of electrodes associated with each cell. In a write operation, the resulting programming signal causes Joule heating of the phase-change material to an appropriate temperature to induce the desired cell-state on cooling. Reading of PCM cells is performed using cell resistance as a metric for cell-state. An applied read voltage causes a current to flow through the cell, this read current being dependent on resistance of the cell. Measurement of the cell read current therefore provides an indication of the programmed cell state. A sufficiently low read voltage is used for this resistance metric to ensure that application of the read voltage does not disturb the programmed cell state. Cell state detection can then be performed by comparing the resistance metric with predefined reference levels for the s programmable cell-states.

PCRAM cell 100 includes a volume of PCM 102 located between a top electrode 106 and a heater layer and bottom electrode 130. The cell state shown represents an intermediate state in which the material 102 contains both crystalline and amorphous phases. The amorphous phase is indicated by the shaded hemispherical volume 104 above bottom electrode 130. The crystalline phase 105 occupies the remainder of the PCM 102 volume. When a read voltage is applied to read the programmed cell-state, the resulting read current flows primarily via this current path from crystalline phase 105 to bottom electrode 130, in preference to flowing through the high-resistance amorphous phase 104.

PCRAM cell 100 includes TFR 112 located upon the top surface of the top electrode 106. In some implementations, the conductivity of electrode 106 and/or bottom electrode 130 may be too high to allow amorphization of the phase change material at low drive current. During resistance state switching of the device, this high conductivity may cause electromigration due to a sudden increase in current. As such, the inclusion of TFR 122 acts as a current step down that limits the electrical current during switching of the PCM 102 from surrounding integrated circuitry during operation. By limiting the electrical current through the PCM 102 volume with the TFR 112, PCRAM cell 100 endurance may be improved and adverse impacts to component(s) that neighbor the PCRAM cell 100 may be limited. Further, TFR 112 may also serve as a thermal barrier during switching operations of the PCM 102. Heat generated in PCM volume 102 is generally transferred and lost through top electrode 106. The TFR 112 reduces this thermal loss and the requisite electrical current to switch the state of PCM volume 102 of PCRAM cell 100.

TFR 122 generally is a film or sheet that covers the entire surface of the top state influencing electrode or bottom state influencing electrode of the NVM cell between the electrode and the top wire 140 or bottom wire 150, respectfully. Therefore, top wire 140 or bottom wire 150, as applicable, is electrically serially separated from the top state influencing electrode or bottom state influencing electrode, respectively by the TFR 122.

TFR 122 is formed of a semiconductor, dielectric, or insulator material with a resistance between, for example, 1 kiloohm and 10 megaohms. TFR 122 may be Aluminium nitride (AlN), or the like. Generally, the resistance of TFR 122 is dependent upon the resistance across the memory cell (minus the TFR 122). TFR 122 may be formed of a semiconductor if the resistance of the cell (minus the TFR 122) is on the conductive side (memory cell resistance has a similar resistance to e.g., TaN). Typically, the target resistance of TFR 122 may be 1000-10× less resistive than the lowest resistance state of the memory cell. For example, if the lowest resistance across PCRAM cell 100 (minus the TFR 122) is 1 megaohm, the TRF 122 may have a resistance of 25 kiloohms. If TFR 122 is too resistive, the TFR 122 dominates the cell and voltage requirements may be too high, and if TFR 122 resistance is too low, TFR 122 may not be adequate as a ballast resistor.

Encapsulation spacer(s) 108 may be located upon or otherwise connected to the sidewall or side boundary of the PCM 102 volume, the sidewall or the side boundary of the top electrode 106, and the sidewall of the side boundary of TFR 112. An upper surface of the encapsulation spacer(s) 108 may be coplanar with the upper surface of the TFR 112 and a lower surface of the encapsulation spacer(s) 108 may be coplanar with the lower surface of the PCM volume 102.

Figure 10:
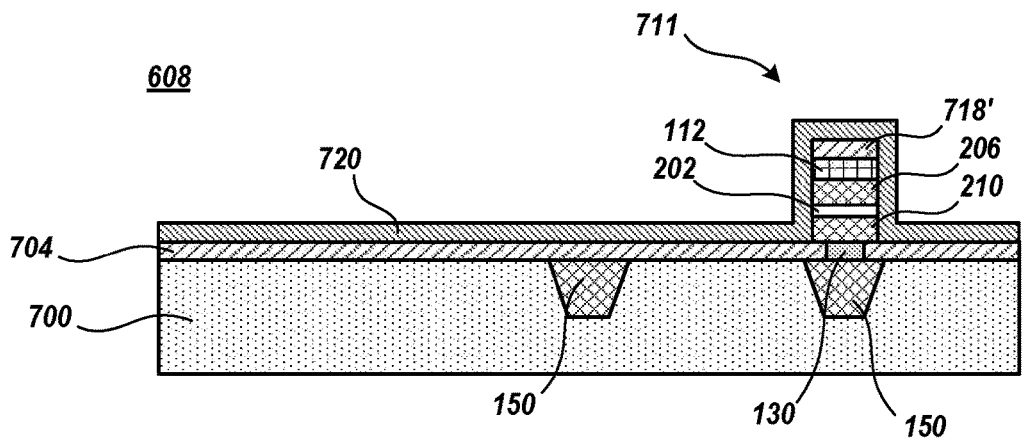

In some implementations, encapsulation spacer(s) 108 may be omitted and ILD 730, shown for example in FIG. 10, may be formed in place thereof (i.e., ILD 730 may contact the sidewall or side boundary of the PCM 102 volume, the sidewall or the side boundary of the top electrode 106, and the sidewall of the side boundary of TFR 112).

A top wire 140 may be connected to the top surface of the TFR 112 and a bottom wire 150 may be connected to the bottom electrode 130. The top wire 140 and/or the bottom wire 150 may be electrically connected to other components in the IC device, such as a memory controller, or the like, as is known in the art.

Figure 2:
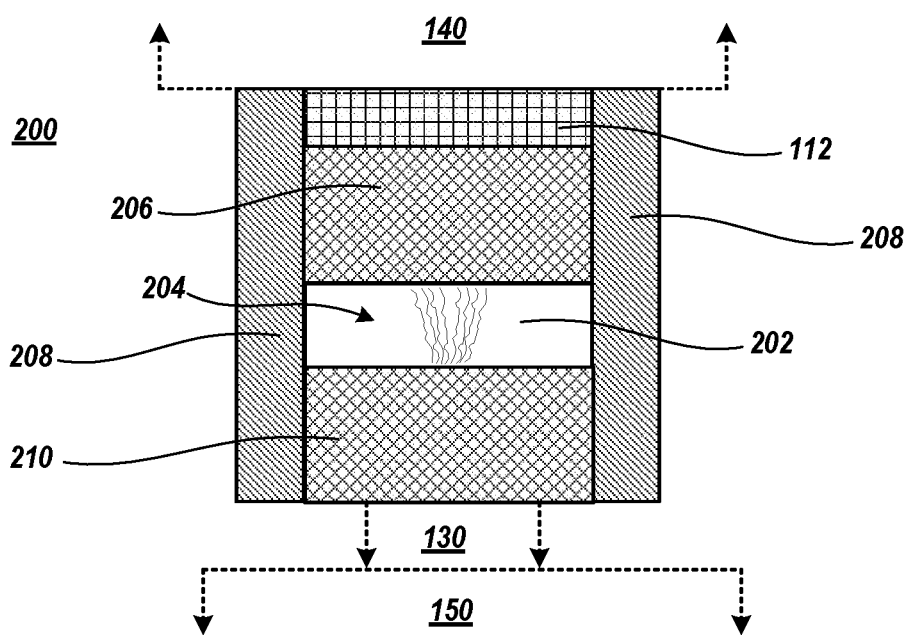
FIG. 2 depicts a cross section of a RRAM cell that includes an integrated thin film resistor and etch stop, in accordance with various embodiments of the present invention.

FIG. 2 depicts a cross section of RRAM cell 200 that includes an TFR 112, in accordance with various embodiments of the present invention.

RRAM is a non-volatile solid-state memory technology that exploits the change in resistance switching of an insulator, such as a binary metal oxide, under an applied electric field. The fundamental storage unit (the "cell") can be programmed into a number of different states, or levels, which exhibit different resistance characteristics. The programmable cell-states can be used to represent different data values, permitting storage of information.

RRAM architecture typically consists of a resistive switching memory cell having a metal-insulator-metal structure generally referred to as MIM structure. The structure comprises of an insulating layer (I) sandwiched between the two metal (M) electrodes. The application of a voltage pulse across the RRAM cell enables a transition of the device from a high resistance state (HRS), or OFF state generally referred as logic value '0' to a low resistance state (LRS), or ON state generally referred as logic value '1' and vice versa.

Typically, an as-prepared RRAM cell is initially in the HRS, to switch the device from the HRS to the LRS, the application of voltage (e.g., high voltage pulse, etc.) enables the formation of conductive paths, which may be referred to as filaments, in the switching layer and the RRAM cell is switched into a LRS. This process which occurs due to the soft breakdown of the metal insulator metal (MIM) structure is usually referred to as 'electroforming' and the voltage at which this process occurs is referred to as forming voltage. To switch the RRAM cell from the LRS to HRS, a voltage pulse referred to as the RESET voltage is applied.

To read data from RRAM cell, a read voltage which will not disturb the current state of the cell is applied to determine whether the cell is in the logic 0 (HRS) or the logic 1 (LRS) state. Since both LRS and HRS retain their respective values even after the removal of applied voltage, RRAM is a non-volatile memory.

The switching of the RRAM cell is based on the growth of a conductive filament (CF) inside the insulating layer. The CF is a channel having a diameter of the order of nanometers which connects the top and the bottom electrodes of the memory cell. The low LRS with high conductivity is obtained when the CF is connected between the electrodes and the HRS results when the filament is disconnected with a gap between the electrodes.

In multilevel RRAM devices, the cell can be set to s>2 programmable states permitting storage of more than one bit per cell. The different programmable states correspond to different relative proportions of the CF within the volume of the insulating material. In particular, in addition to the two states used for single-level operation, multilevel cells exploit intermediate states in which the cell contains different volumes a particular CF or numbers of distinct CFs. Since the LRS and HRS exhibit a large resistance contrast, varying the size of one CF within the overall cell volume or increasing the number of distinct CFs produces a corresponding variation in cell resistance.

RRAM cell 200 includes insulator material 202 located between a top electrode 206 and a bottom electrode 210. The cell state shown represents an intermediate state in which CFs 204 are forming within the insulator 202. When a read voltage is applied to read the programmed cell-state, the resulting read current flows primarily via the current path from top electrode 206 to bottom electrode 210 through the CF 204, in preference to flowing through the high resistance insulator material 202 in which the CFs 204 have not formed.

RRAM cell 200 also includes TFR 112 located upon the top surface of the top electrode 206. Since in some implementations the conductivity of top electrode 206 may be too high to drive optimal or desired state changing behavior within the insulator 202, TFR 122 acts as a current step down that limits or generally reduces the electrical current from the top electrode 206 through the insulator 202. TFR 122 may serve as a ballast resistor upon when the filament 204 of the RRAM cell 200 is formed. As soon as a connection is made, the current at a given voltage jumps up and the TFR 122 acts as a ballast resistor through the cell 200. By limiting the electrical current through the insulator 202 with the TFR 112, RRAM cell 200 endurance may be improved and adverse impacts to component(s) that neighbor the RRAM cell 200 may be limited.

Encapsulation spacer(s) 208 may be located upon or otherwise connected to the sidewall or side boundary of the MIM stack and the sidewall of the side boundary of TFR 112. An upper surface of the encapsulation spacer(s) 208 may be coplanar with the upper surface of the TFR 112 and a lower surface of the encapsulation spacer(s) 208 may be coplanar with the lower surface of the bottom electrode 210.

In some implementations, encapsulation spacer(s) 208 may be omitted and ILD 730, shown for example in FIG. 10, may be formed in place thereof (i.e., ILD 730 may contact the sidewall or side boundary of the MIM stack and contact the sidewall of the side boundary of TFR 112).

A top wire 140 may be connected to the top surface of the TFR 112 and a bottom wire 150 may be connected to the bottom electrode 210. The top wire 140 and/or the bottom wire 150 may be electrically connected to other components in the IC device, such as a memory controller, or the like, as is known in the art.

Figure 3:
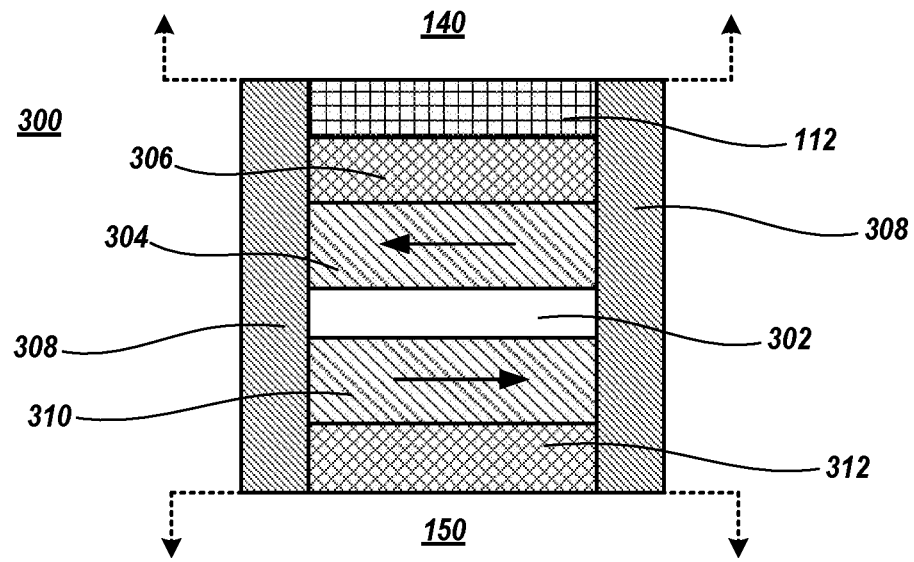
FIG. 3 depicts a cross section of a magnetoresistive random-access memory (MRAM) cell that includes an integrated thin film resistor and etch stop, in accordance with various embodiments of the present invention.

FIG. 3 depicts a cross section of MRAM cell 300 that includes TFR 112, in accordance with various embodiments of the present invention.

MMRAM is a non-volatile solid-state memory technology that exploits the change in resistance switching of an insulator relative to the magnetic orientation of two ferromagnetic plates. The fundamental storage unit (the "cell") can be programmed into at least two different states, or levels, which exhibit different resistance characteristics. The programmable cell-states can be used to represent different data values, permitting storage of information.

MMRAM architecture typically relies upon a magnetic tunnel junction (MJR) structure where two ferromagnetic layers are separated by a dielectric spacer layer, which may also be referred to as a tunnel barrier. When the tunnel barrier is very thin, typically <2 nm, quantum mechanical tunneling of electrons through the barrier makes the MTJ behave like a resistor having a resistance that depends exponentially on the barrier thickness and is proportional to the inverse of the in-plane barrier area. The tunneling current is spin-polarized, due to the asymmetric band structure of the ferromagnetic electrodes, giving rise to the tunneling magnetoresistance.

The relative orientation of the magnetizations in these two layers determines the resistance of the MTJ device. For most materials, the LRS is when the magnetizations of the two layers are parallel, because the majority band electrons can tunnel into the majority band on the opposite side of the barrier. The HRS exists when the orientation is antiparallel, since the majority band electrons have to tunnel into the minority band of the opposite layer.

One of the ferromagnetic layers is a free layer, sometimes called recording layer or storage layer, and is the ferromagnetic layer retaining the stored information. This layer is often made of. The tunnel barrier is typically an insulating non-magnetic layer, that provides means to switch and read the state of the free layer with a spin-polarized tunneling current. The other ferromagnetic layer is a fixed or reference layer and provides a stable reference magnetization direction for the free layer reading and switching. This fixed layer is designed to have magnetic anisotropy much higher than the free layer so that it never switches during memory operation.

Data may be written to the MRAM cell by passing electrical current through wires above and below the MRAM cell which induces a magnetic field, which the free layer adopts.

Reading data from the MRAM cell may be accomplished by measuring the electrical resistance of the cell. Because of the tunnel magnetoresistance, the electrical resistance of the cell changes with the relative orientation of the magnetization in the two plates. By determining the resistance inside any particular MRAM cell, the magnetization polarity of the free layer may be determined.

MRAM cell 300 includes barrier layer 302 located between a top ferromagnetic free layer 304 and a bottom ferromagnetic fixed layer 310. MRAM cell 300 further includes a top electrode 306 connected to the top surface of the top ferromagnetic free layer 304 and may include a bottom electrode 312 connected to the bottom surface of the bottom ferromagnetic fixed layer 310. The cell state shown represents the HRS state in which the magnetic orientation between top ferromagnetic free layer 304 and bottom ferromagnetic fixed layer 310 is antiparallel.

MRAM cell 300 also includes TFR 112 located upon the top surface of the top electrode 306. Since, in some implementations, the conductivity of top electrode 306 may be too high to drive optimal or desired state changing behavior within the ferromagnetic free layer 304, TFR 122 acts as a current step down that limits or generally reduces the electrical current though the top electrode 306 that influences the ferromagnetic free layer 304. By limiting the electrical current through the top electrode 306 with the TFR 112, MRAM cell 300 endurance may be improved and adverse impacts to component(s) that neighbor the MRAM cell 300 may be limited.

Encapsulation spacer(s) 308 may be located upon or otherwise connected to the sidewall or side boundary of the MTJ stack, the sidewall of the side boundary of top electrode 306, and the sidewall of the side boundary of TFR 112. An upper surface of the encapsulation spacer(s) 308 may be coplanar with the upper surface of the TFR 112 and a lower surface of the encapsulation spacer(s) 308 may be coplanar with the lower surface of the bottom electrode 312.

In some implementations, encapsulation spacer(s) 308 may be omitted and ILD 730, shown for example in FIG. 10, may be formed in place thereof (i.e., ILD 730 may contact the sidewall or side boundary of the MTJ stack, the sidewall of the side boundary of top electrode 306, the sidewall or side boundary 330, and the sidewall of the side boundary of TFR 112).

A top wire 140 may be connected to the top surface of the TFR 112 and a bottom wire 150 may be connected to the bottom electrode 330. The top wire 140 and/or the bottom wire 150 may be electrically connected to other components in the IC device, such as a memory controller, or the like, as is known in the art.

Figure 4:
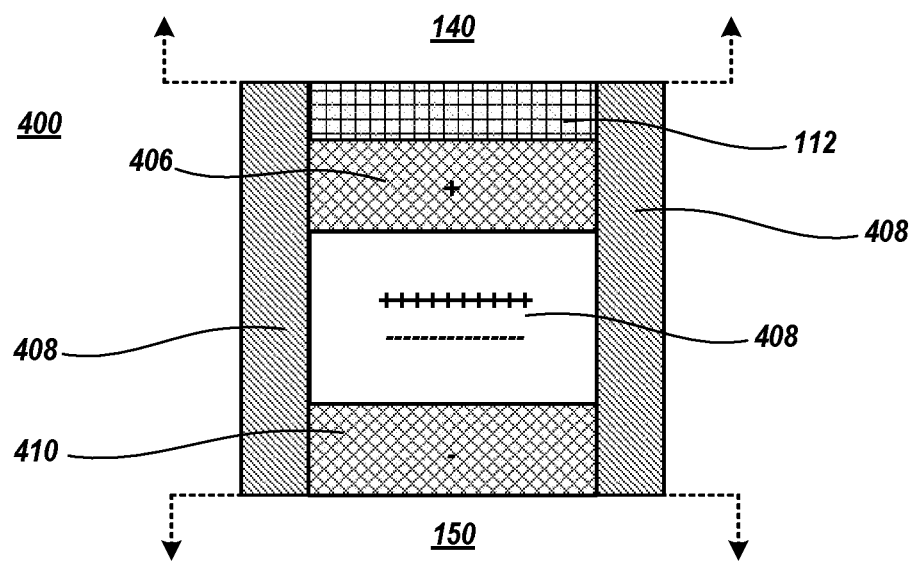
FIG. 4 depicts a cross section of a ferroelectric RAM (FRAM) cell that includes an integrated thin film resistor and etch stop, in accordance with various embodiments of the present invention.

FIG. 4 depicts a cross section of FRAM cell 400 that includes TFR resistor 112, in accordance with various embodiments of the present invention.

FRAM is a non-volatile solid-state memory technology that exploits the presence or lack of an electrical charge in a capacitor that includes a ferroelectric dielectric between electrodes. The fundamental storage unit (the "cell") can be programmed into at least two different states, or levels, which exhibit different charge characteristics. The programmable cell-states can be used to represent different data values, permitting storage of information.

FRAM architecture may consist of a grid such capacitors and their associated wiring and signaling transistors. Each cell typically operates in association with one signaling transistor. Data may be stored as the presence or lack of an electrical charge in the ferroelectric capacitor, with the lack of charge in general representing "0" and the presence of an electrical charge representing "1." Writing is accomplished by applying a field across the ferroelectric layer by charging the electrodes on either side of it, forcing the atoms inside into the "up" or "down" orientation (depending on the polarity of the charge), thereby storing a "1" or "0". Reading the cell may be accomplished by the signaling transistor forcing the cell into a particular state, say "0". If the cell already held a "0", nothing will happen in the output lines. If the cell held a "1", the re-orientation of the atoms in the film will cause a brief pulse of current in the output as they push electrons out of the metal on the "down" side. The presence of this pulse means the cell held a "1". Since this process overwrites the cell, reading FeRAM is a destructive process, and requires the cell to be re-written.

FRAM cell 400 includes a ferroelectric dielectric layer 408 located between a top electrode 406 and a bottom electrode 410. FRAM cell 400 may operate in conjunction with a switching transistor as is known in the art. The cell state shown represents the charged state in which there is a presence of an electrical charge in the ferroelectric dielectric layer 408, which typically represents the cell 400 storing a "1."

FRAM cell 400 also includes TFR 112 located upon the top surface of the top electrode 406. Since, in some implementations, the conductivity of top electrode 406 may be too high to drive optimal or desired state changing behavior within the ferroelectric dielectric layer 408, TFR 122 acts as a current step down that limits or generally reduces the electrical current though the top electrode 406 and resultantly reduces the electrical charge across the ferroelectric dielectric layer 408. By limiting the electrical current through the top electrode 406 with the TFR 112, FRAM cell 400 endurance may be improved and adverse impacts to component(s) that neighbor the FRAM cell 400 may be limited.

Encapsulation spacer(s) 408 may be located upon or otherwise connected to the sidewall or side boundary of the capacitor stack and the sidewall of the side boundary of TFR 112. An upper surface of the encapsulation spacer(s) 408 may be coplanar with the upper surface of the TFR 112 and a lower surface of the encapsulation spacer(s) 408 may be coplanar with the lower surface of the bottom electrode 410.

In some implementations, encapsulation spacer(s) 408 may be omitted and ILD 730, shown for example in FIG. 10, may be formed in place thereof (i.e., ILD 730 may contact the sidewall or side boundary of the capacitor stack and the sidewall of the side boundary of TFR 112).

A top wire 140 may be connected to the top surface of the TFR 112 and a bottom wire 150 may be connected to the bottom electrode 410. The top wire 140 and/or the bottom wire 150 may be electrically connected to other components in the IC device, such as a memory controller, or the like, as is known in the art.

Figure 5:
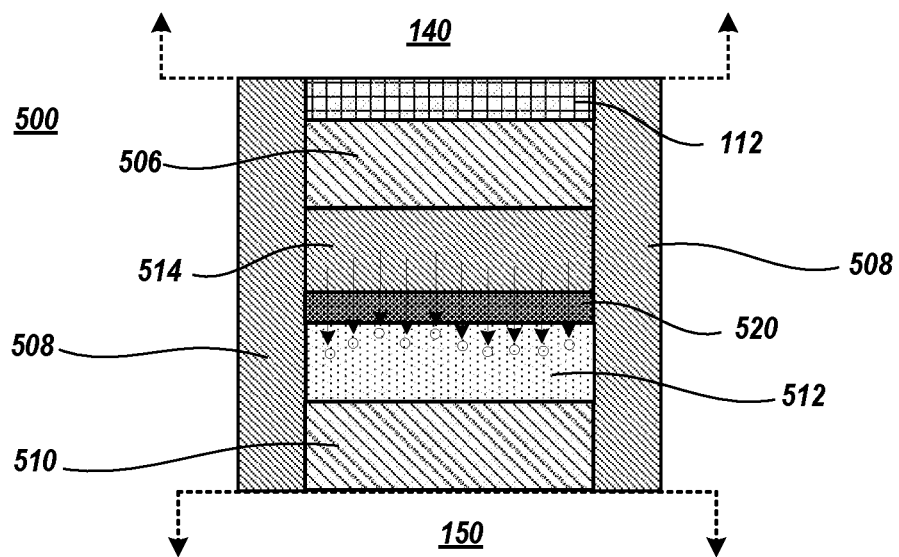
FIG. 5 depicts a cross section of an electrochemical RAM (ECRAM) cell that includes an integrated thin film resistor and etch stop, in accordance with various embodiments of the present invention.

FIG. 5 depicts a cross section of ECRAM cell 500 that includes an TRF 112, in accordance with various embodiments of the present invention.

ECRAM is a non-volatile solid-state memory technology that exploits a change in resistance of a mixed ionic electronic conductor material due to the addition or removal of ions. In some mixed ionic electronic conductor materials, this change occurs due to the introduction or removal of charge carriers. In other mixed ionic electronic conductor materials, the change occurs due to an electronic transition, e.g. Mott transition. The fundamental storage unit (the "cell") can be programmed into at least two different states, or levels, which exhibit different resistance characteristics. These programmable cell-states can be used to represent different data values, permitting storage of information.

An ECRAM may include a bottom electrode, a first mixed ionic electronic conductor, a barrier, a second mixed ionic electronic conductor, and a top electrode. The resistance across the cell is modulated by ionic exchange between first mixed ionic electronic conductor and the second mixed ionic electronic conductor across the barrier upon application of an electric field. The charge-transfer process allows both for state retention in the absence of applied power, and for programming of distinct states.

When given an adequate high voltage write or programing pulse, ions charge transfer and move across the barrier. The ions then relax after the programming. Due to the high programming pulse, the ions are pulled out of one of the mixed ionic electronic conductors and its resistance decreases thereby programming the cell into the LRS. If a low programming pulse is applied, insufficient ions are moved from first mixed ionic electronic conductor and the cell state maintained in the HRS. After programming, the cell may be reset to ensure the cell is in the HRS by applying a reset voltage.

To read data from ECRAM cell, a read voltage which will not disturb the current state of the cell is applied to determine whether the cell is in the logic 0 (HRS) or the logic 1 (LRS) state. Since both LRS and HRS retain their respective values even after the removal of applied voltage, ECRAM is a non-volatile memory.

ECRAM cell 500 includes a bottom electrode 510, a first mixed ionic electronic conductor 512, a electrically conductive ion barrier 520, a second mixed ionic electronic conductor 514, and a top electrode 506. The resistance across the cell 500 is modulated by ionic exchange between first mixed ionic electronic conductor 512 and the second mixed ionic electronic conductor 514 across the barrier 520 upon application of an electric field to e.g., the top electrode 506 or the bottom electrode 510. The charge-transfer process allows both for state retention in the absence of applied power, and for programming of distinct states.

When an adequate high voltage write or programing pulse is applied at e,g, top electrode 506 or the bottom electrode 510, ions charge transfer and move across the barrier 520. For example, as depicted, a high write voltage is applied at the top electrode 506 and ions are pulled out the second mixed ionic electronic conductor 514 and move across the barrier 520 into the first mixed ionic electronic conductor 512. The resistance of second mixed ionic electronic conductor 514 resultantly decreases, thereby programming the cell into the LRS.

To read data from ECRAM cell 500, a read voltage which will not disturb the current state of the cell is applied at e,g, top electrode 506 or the bottom electrode 510 to determine whether the cell is in the logic 0 (HRS) or the logic 1 (LRS) state. Since both LRS and HRS retain their respective values even after the removal of applied voltage, ECRAM is a non-volatile memory.

ECRAM cell 500 also includes TFR 112 located upon the top surface of the top electrode 506. TFR 112 may mitigate voltage flux imparted by relaxing ions. In ECRAM, after programing the cell 500, ions may relax back over the barrier 520 and the cell 500 resulting holds some voltage. In some applications, the TFR 112 may mitigates this effect of the ions relaxing back over the barrier 520. In addition, should a cell 500 form a short across the barrier 520, the TFR 112 provide a base resistance value to, for example, identification for dropping from a neural net. Further, in some implementations the conductivity of top electrode 506 may be too high to drive optimal or desired state changing behavior of between the mixed ionic electronic conductors 514, 516, and TFR 122 acts as a current step down that limits or generally reduces the current across top electrode 506. By limiting the electrical current through the top electrode 506 with the TFR 112, ECRAM cell 500 endurance may be improved and adverse impacts to component(s) that neighbor the ECRAM cell 500 may be limited.

Encapsulation spacer(s) 508 may be located upon or otherwise connected to the sidewall(s) or side boundary(ies) of the mixed ionic electronic conductors 514, 516 of the barrier 520, of the bottom electrode 510, of the top electrode 506, and of TFR 112. An upper surface of the encapsulation spacer(s) 508 may be coplanar with the upper surface of the TFR 112 and a lower surface of the encapsulation spacer(s) 508 may be coplanar with the lower surface of the bottom electrode 510.

In some implementations, encapsulation spacer(s) 508 may be omitted and ILD 730, shown for example in FIG. 10, may be formed in place thereof (i.e., ILD 730 may contact the sidewall(s) or side boundary(ies) of the mixed ionic electronic conductors 514, 516 of the barrier 520, of the bottom electrode 510, of the top electrode 506, and of TFR 112).

A top wire 140 may be connected to the top surface of the TFR 112 and a bottom wire 150 may be connected to the bottom electrode 510. The top wire 140 and/or the bottom wires 150, 150' may be electrically connected to other components in the IC device, such as a memory controller, or the like, as is known in the art.

Though different solid state NVM cells are depicted in FIG. 1 through FIG. 5, each of these cells include a top state influencing electrode. The term "top state influencing electrode" is defined herein to be a top electrically conductive electrode within the NVM cell that is in direct contact with a state or property changing material or structure also within the NVM cell (i.e. theoretically no resistance/impedance between this electrode and the state or property changing material or structure) that which influences that state, property, etc. of the state or property changing material or structure that which the electrode is directly connected. Any wiring features generally above the NVM cell, such as upper wire 140, should not be interpreted as the top state influencing electrode since upper wire 140 is generally not part of the NVM cell and since the upper wire 140 is merely indirectly connected to the property changing material or structure within the NVM cell (i.e. there is resistance/impedance between this top wire 140 and the state or property changing material or structure through e.g., the top electrode 106, 206, 306, 406, 506, etc.).

For example, in FIG. 1 top electrode 106 is a top state influencing electrode because it is the top electrically conductive electrode within the PCRAM cell 100 that is in direct contact with PCM 102 that changes states (i.e. resistance) based upon the phase of the material of PCM 102. Regarding FIG. 2, top electrode 206 is a top state influencing electrode because it is the top electrically conductive electrode within the RRAM cell 200 that is in direct contact with insulator 202 that changes states (i.e. resistance) based upon CF(s) 204 growth therein. Regarding FIG. 3, top electrode 306 is a top state influencing electrode because it is the top electrically conductive electrode within the MRAM cell 300 that is in direct contact with ferromagnetic free layer 304 that changes states (i.e. polarity) which drives the change in resistance of insulator 302. Regarding FIG. 4, top electrode 406 is a top state influencing electrode because it is the top electrically conductive electrode within the FRAM cell 400 that is in direct contact with ferroelectric dielectric layer 408 that changes states (i.e. atoms inside ferroelectric dielectric layer 408 are in the "up" or "down" orientation) based upon the presence of an electric field there across. Regarding FIG. 5, top electrode 506 is a top state influencing electrode because it is the top electrically conductive electrode within the ECRAM cell 500 that is in direct contact with mixed ionic electronic conductor 514 that changes states (i.e. depletion of ions causing the material to become more conductive) which drives resistance change in the conductive mixed ionic electronic conductor 514. Regarding FIG. 19, top electrode 906 is a top state influencing electrode because it is the top electrically conductive electrode within the CBRAM cell 900 that is in direct contact with solid state electrolyte 902 that changes states (i.e. resistance) based upon CF(s) 904 growth therein.

FIG. 6 through FIG. 14 depict cross-sectional views of fabrication stages of a fabrication method of forming an IC device that includes one or more solid state NVM cell(s) that includes TFR 112, in accordance with various embodiments of the present invention. In the exemplary fabrication stages depicted, an RRAM cell 400 that includes TFR 112 is fabricated. Similar techniques may be utilized to fabricate the other types NVM cells contemplated herein. Such techniques may be described with reference to FIG. 6 through FIG. 13 but are associated with the specific type of NVM cell referenced.

Figure 6:
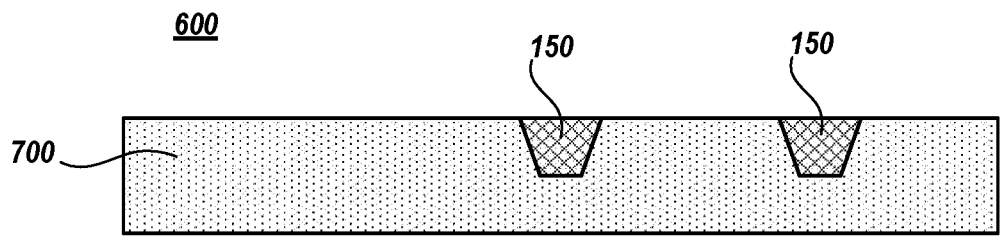
FIG. 6 through FIG. 14 depict cross-sectional views of fabrication stages of a fabrication method of forming an IC device that includes one or more solid state NVM cell(s) that includes an integrated thin film resistor and etch stop, in accordance with various embodiments of the present invention.

FIG. 6 depicts a cross-sectional view of fabrication stage 600 of a fabrication method of forming an IC device that includes an NVM cell that includes TFR 112, in accordance with various embodiments of the present invention.

At stage 600, bottom wire(s) 150 may be formed upon a substrate 700. Bottom wire 150 may be formed of a material utilized as IC device wires, such as, for example, Copper, Tungsten, Platinum, Titanium Nitride, Tantalum Nitride, Titanium Aluminum Nitride, or the like. Substrate 700 is generally formed from a dielectric material. In a preferred implementation, substrate 700 may be formed from a low-k dielectric material (i.e., a material with a smaller dielectric relative to silicon dioxide). In some implementations, substrate 700 may be an inter-layer dielectric (ILD) layer whereby additional layer(s) of the IC device have previously been fabricated there below.

Bottom wire 150 may formed within the substrate 700 by any method known in the art. For example, trench(es) may be formed within the substrate 700 by known photolithographic techniques and then filled with the bottom wire 150 material. Chemical mechanical planarization, or other known methods, may be used to remove excess bottom wire 150 material from the upper surface of substrate 700.

Bottom wire 150 may be electrically connected to other components of the IC device by one or more electrical pathways, as is known in the art. For example, one or more electrical pathways may connect bottom wire 150 with a memory controller, or the like. In this manner, components of the IC device may be electrically connected to the NVM cell via the bottom wire 150.

Figure 7:
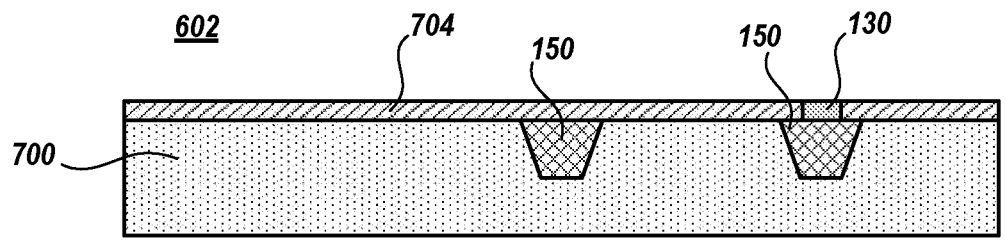

FIG. 7 depicts a cross-sectional view of fabrication stage 602 of a fabrication method of forming an IC device that includes an NVM cell that includes TFR 112, in accordance with various embodiments of the present invention.

At stage 602, heating layer 704 may be formed upon substrate 700 and upon bottom wire(s) 150 and bottom electrode(s) 706 may be formed within heating layer 704.

Heating layer 704 may be, for example, a Silicon layer or Silicon-based layer such as Silicon Nitride layer. A bottom electrode 706 is formed within the heating layer 704 by any method known in the art. For example, a trench may be formed within the heating layer 704 utilizing known photolithography techniques and then filled with the bottom electrode 706 material. Chemical mechanical planarization, or other known methods, may be used to remove excess bottom electrode 706 material from the upper surface of heating layer 704. The bottom electrode 706 material may be any generally conductive material that is used as an electrode, such as, for example, Tungsten, Platinum, Titanium Nitride, Tantunum Nitride, Titanium Aluminum Nitride, or the like.

In certain implementations, the trench is formed though the heating layer 704, thereby exposing a portion of an upper surface of a bottom wire 150 previously formed in substrate 700. As such, the bottom electrode 706 may contact bottom wire 150.

For clarity, some of the NVM cells such as the PCM cell 100, the RRAM cell 200, CBRAM 900 and the like, contemplated herein may utilize heating layer 704. However, other NVM cells, such as the MRAM cell 300, FRAM cell 400, and ECRAM 500 may not utilize heating layer 704. As such, the fabrication of heating layer 704 and/or bottom electrode 706 formed therein may be an optional fabrication stage dependent upon the desired NVM cell fabricated.

Figure 8:
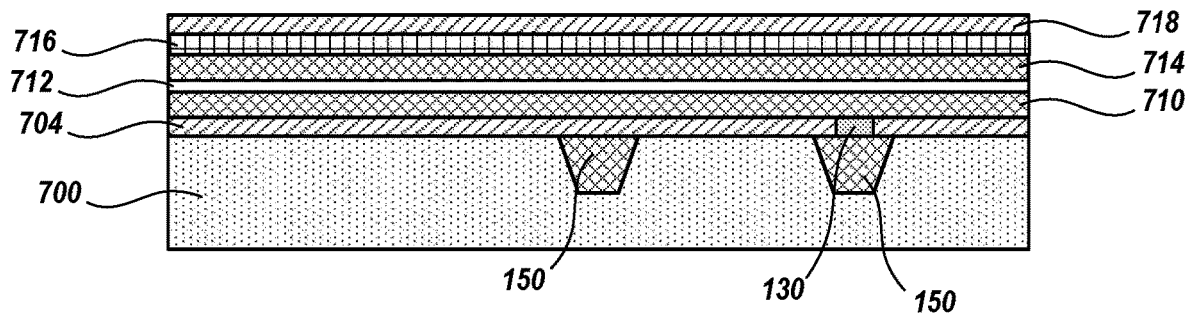

FIG. 8 depicts a cross-sectional view of fabrication stage 604 of a fabrication method of forming an IC device that includes an NVM cell that includes TFR 112, in accordance with various embodiments of the present invention.

At stage 604 NVM cell build up layers are fabricated. For example, to fabricate a RRAM cell 200, as depicted, bottom electrode material layer 710 is formed upon the heating layer 704, insulator material layer 712 is formed upon the bottom electrode material layer 710, top electrode material layer 714 is formed upon the insulator material layer 712, etch stop TRF layer 716 is formed upon the top electrode material layer 714, and/or a capping layer 718 is formed upon the etch stop TRF layer 716.

Bottom electrode material layer 710 may be formed upon the heating layer 704 by depositing electrically conductive electrode material, such as Titanium Nitride, onto the heating layer 704 and/or onto the electrode 706. Bottom electrode material layer 710 may be formed to a thickness between 5 and 75 nm. In a preferred embodiment, bottom electrode material layer 710 may be formed to a thickness between 20 and 30 nm.

Insulator material layer 712 may be formed upon the bottom electrode material layer 710 by depositing dielectric material, such as Silicon Nitride, onto the bottom electrode material layer 710. Insulator material layer 712 may be formed to a thickness between 10 and 100 nm. In a preferred embodiment, insulator material layer 712 may be formed to a thickness between 40 and 50 nm.

Top electrode material layer 714 is formed upon the insulator material layer 712 by depositing electrically conductive electrode material, such as Titanium Nitride, upon the insulator material layer 712. Top electrode material layer 714 is generally, but not required, formed of the same material as the material of the bottom electrode material layer 710. Top electrode material layer 714 may be formed to a thickness between 5 and 75 nm. In a preferred embodiment, top electrode material layer 714 may be formed to a thickness between 15 and 25 nm.

Etch stop TRF layer 716 is formed upon the top electrode material layer 714 by depositing resistive material, such as Aluminium Gallium Nitride (AlGaN), Nitride rich Tantalum Nitride, or the like upon the top electrode material layer 714. Etch stop TRF layer 716 may be formed to a thickness between 1 and 20 nm. In a preferred embodiment, etch stop TRF layer 716 may be formed to a thickness between 2 and 10 nm.

Capping layer 718 is formed upon the etch stop TRF layer 716 by depositing a dielectric material, such as Silicon Nitride, or the like upon etch stop TRF layer 716. Capping layer 718 may be formed to a thickness between 10 and 80 nm. In a preferred embodiment, capping layer 718 may be formed to a thickness between 30 and 40 nm.

In PCRAM cell 100 embodiments, the cell build up layers may be fabricated by depositing a phase change material layer upon heating layer 704, by depositing a top electrode material layer upon the phase change material layer, by depositing a etch stop TFR layer upon the top electrode material layer, and by depositing a capping layer upon the etch stop TFR layer.

In MRAM cell 300 embodiments, the cell build up layers may be fabricated by depositing a ferromagnetic fixed material layer upon the substrate and/or upon the bottom wire, by depositing barrier material layer upon the ferromagnetic fixed material layer, by depositing a top ferromagnetic free layer upon the barrier material layer, by depositing a etch stop TFR layer upon the top electrode material layer, and by depositing a capping layer upon the etch stop TFR layer.

In FRAM cell 400 embodiments, the cell build up layers may be fabricated by depositing a bottom electrode material layer upon the substrate and/or upon the bottom wire, by depositing a ferroelectric dielectric material layer upon the bottom electrode material layer, by depositing a top electrode material layer upon the ferroelectric dielectric material layer, by depositing a etch stop TFR layer upon the top electrode material layer, and by depositing a capping layer upon the etch stop TFR layer.

In ECRAM cell 500 embodiments, the cell build up layers may be fabricated by depositing a bottom electrode material layer upon the substrate and upon a bottom wire, by depositing mixed ionic electronic conductor material layer upon the bottom electrode material layer, by depositing barrier material upon the mixed ionic electronic conductor material layer, by depositing mixed ionic electronic conductor material layer upon the barrier layer, by depositing to electrode material layer upon the mixed ionic electronic conductor material layer, by depositing a etch stop TFR layer upon the gate electrode material layer, and by depositing a capping layer upon the etch stop TFR layer.

In CBRAM cell 900 embodiments, the cell build up layers may be fabricated by depositing a bottom electrode material layer upon the substrate/heating layer, by depositing a solid state electrolyte material layer upon the bottom electrode material layer, by depositing a top electrode material layer upon the solid state electrolyte material layer, by depositing a etch stop TFR layer upon the gate electrode material layer, and by depositing a capping layer upon the etch stop TFR layer.

Known photolithography layers such as a mask layer and a developer layer may also be formed upon the capping layer and a developer layer may be formed upon the mask layer.

Figure 9:
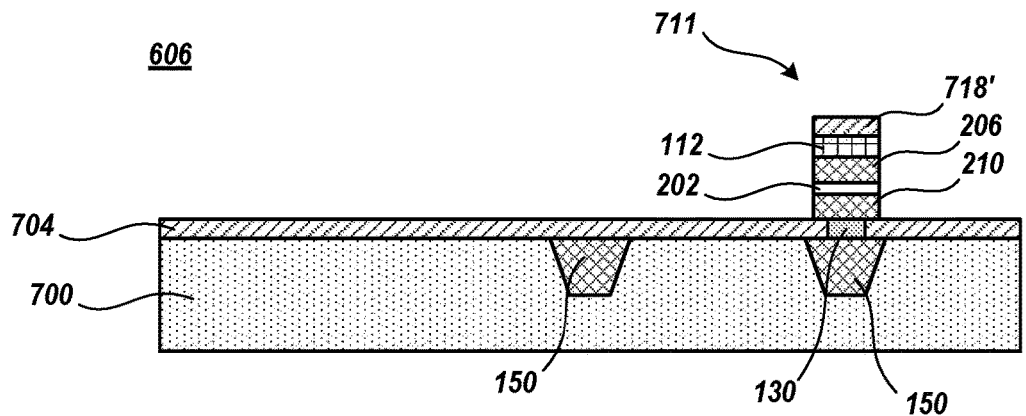

FIG. 9 depicts a cross-sectional view of fabrication stage 606 of a fabrication method of forming an IC device that includes an NVM cell that includes TFR 112, in accordance with various embodiments of the present invention. At stage 606, an etching technique removes undesired or exposed cell build up layer portions and retains desired cell build up layer portions to form a cell stack 711.

Known photolithography techniques may be utilized to develop or pattern the mask layer to leave portions of the mask layer upon the top layer of the cell build up layer thereby defining and protecting cell build up layers there below from an etchant of a chemical etch or high energy kinetic energy (ion, electron, or photon) beams of a dry etch. The protected underlying desired cell build up layers are thereby retained and effectively forms cell stack 711. The etching technique generally removes the undesired cell build up layer portions and generally exposes the heating layer 704 (if present) or substrate 700 (if heating layer 704 is not present) in the field generally outside of the formed cell stack 711.

The etch technique utilized in stage 606 may be a physical or dry etch technique or a chemical wet etch. In a preferred implementation, the etch technique of stage 606 is a physical dry etch and, as such, there is less risk for damage (e.g., limited lateral etching of the cell stack 711 materials may be experienced due to the lack of chemical etchants) to the formed cell stack 711 materials.

In an RRAM cell 200 embodiment, as depicted, the cell stack 711 includes bottom electrode 210 formed from a retained portion of the bottom electrode material layer 710, insulator material 202 formed from a retained portion of the insulator material layer 712, top electrode 206 formed from a retained portion of the top electrode material layer 714, TFR 112 formed from a retained portion of the etch stop TRF layer 716, and cap 718' formed from a retained portion of the capping layer 718.

In PCRAM cell 100 embodiments, the cell stack 711 may include the volume of PCM 102 formed from a retained portion of the a phase change material layer, the top electrode 106 formed from a retained portion of the top electrode material layer, TFR 112 formed from a retained portion of the etch stop TRF layer 716, and cap 718' formed from a retained portion of the capping layer 718.

In MRAM cell 300 embodiments, the cell stack 711 may include bottom ferromagnetic fixed layer 310 formed from a retained portion of the ferromagnetic fixed material layer, the barrier layer 302 formed from a retained portion of the barrier material layer, top ferromagnetic free layer 304 formed from a retained portion of the top ferromagnetic free layer, TFR 112 formed from a retained portion of the etch stop TRF layer 716, and cap 718' formed from a retained portion of the capping layer 718.

In FRAM cell 400 embodiments, the cell stack 711 may include bottom electrode 410 formed from a retained portion of the bottom electrode material layer, ferroelectric dielectric layer 408 formed from a retained portion of the ferroelectric dielectric material layer, top electrode 406 formed from a retained portion of the top electrode material layer, TFR 112 formed from a retained portion of the etch stop TRF layer 716, and cap 718' formed from a retained portion of the capping layer 718.

In ECRAM cell 500 embodiments, the cell stack 711 may include bottom electrode 510 formed from a retained portion of the bottom electrode material layer, may include bottom electrode 510 formed from a retained portion of the bottom electrode material, may include mixed ionic electronic conductor 512 formed from a retained portion of the mixed ionic electronic conductor material layer, may include barrier 520 formed from a retained portion of the barrier material layer, may include mixed ionic electronic conductor 514 formed from a retained portion of the mixed ionic electronic conductor material layer, may include top electrode 506 formed from a retained portion of the top electrode material layer, may include TFR 112 formed from a retained portion of the etch stop TRF layer 716, and cap 718' formed from a retained portion of the capping layer 718.

In an CBRAM cell 900 embodiment, the cell stack 711 includes bottom electrode 910 formed from a retained portion of the bottom electrode material layer 710, solid state electrolyte 902 formed from a retained portion of the solid state electrolyte layer, top electrode 906 formed from a retained portion of the top electrode material layer 714, TFR 112 formed from a retained portion of the etch stop TRF layer 716, and cap 718' formed from a retained portion of the capping layer 718.

FIG. 10 depicts a cross-sectional view of fabrication stage 608 of a fabrication method of forming an IC device that includes an NVM cell that includes TFR 112, in accordance with various embodiments of the present invention. At stage 608, an encapsulation layer 720 is formed upon the exposed field heating layer 704 (if present) or upon the exposed field substrate 700 (if heating layer 704 is not present) and upon and around the cell stack 711.

Encapsulation layer 720 is a dielectric material layer that prevents or limits shorting between the various cell layers. For example, spacers 208 formed from encapsulation layer 720 prevent bottom electrode 210 and top electrode 206 from contacting. Encapsulation layer 720 may be formed by depositing a dielectric conformal and insulating material, such as Silicon Nitride, Silicon Oxide, Silicon oxynitride, amorphous Carbon, Aluminium nitride, or the like upon the exposed field heating layer 704 (if present) or upon the exposed field substrate 700 (if heating layer 704 is not present) and upon and around the cell stack 711. For example, encapsulation layer 720 may be formed by depositing a blanket dielectric material layer upon the previously exposed field heating layer 704 (if present) or upon the exposed field substrate 700 (if heating layer 704 is not present), upon the sidewall(s) or side surface(s) of the cell stack 711, and upon the upper surface of cell stack 711.

The thickness of the encapsulation layer 720 may be sufficiently thick to protect the cell stack 720, during subsequent etching of the undesired portions of the encapsulation spacer layer 720 such that the undesired encapsulation spacer layer 720 may be removed from the field while being retained upon the cell stack 711 sidewall(s) or side surface (s). For example, encapsulation layer 720 may be formed to a thickness between 2 and 100 nm In a preferred embodiment, encapsulation layer 720 may be formed to a thickness between 40 and 70 nm.

Figure 11:
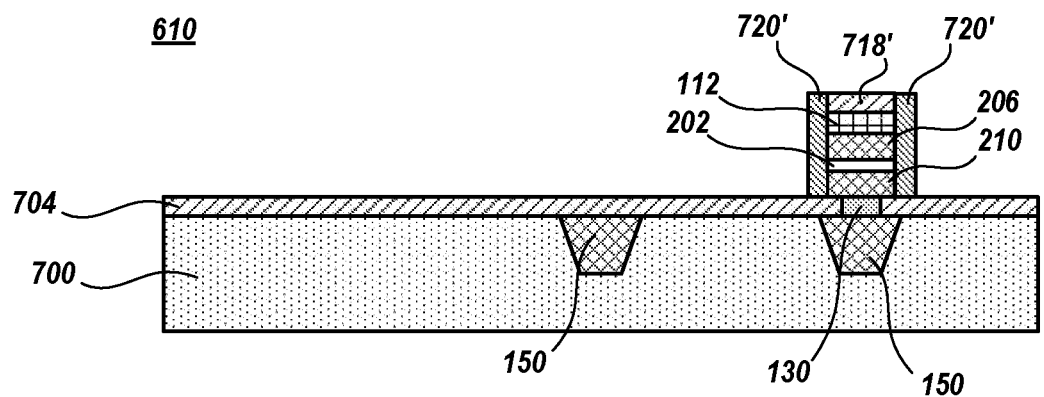

FIG. 11 depicts a cross-sectional view of fabrication stage 610 of a fabrication method of forming an IC device that includes an NVM cell that includes TFR 112, in accordance with various embodiments of the present invention. At stage 610, undesired encapsulation layer 720 portion(s) are etched away while desired encapsulation layer 720' portion(s) are retained upon the sidewall(s) of the cell stack 711.

Known directional etch techniques may be utilized to etch away or otherwise remove the undesired encapsulation layer 720 portion(s). These undesired encapsulation layer 720 portion(s) may be generally horizontal as depicted in the cross section view of FIG. 11 (i.e. layer portion(s) with width greater than height). The directional etch process may retain the desired encapsulation layer 720' portion(s) that are upon the sidewall(s) of the cell stack 711. These desired encapsulation layer 720' portion(s) may be generally vertical as depicted in the cross section view of FIG. 11 (i.e. layer portion(s) with height greater than width).

The etch technique utilized in stage 610 may be a physical or dry etch technique or a chemical wet etch. In a preferred implementation, the etch technique of stage 610 is a chemical wet etch. As such, the heating layer 708 (if present) and substrate 700 (if heating layer 708 is not present) may be configured to be a etch stop.

Figure 12:
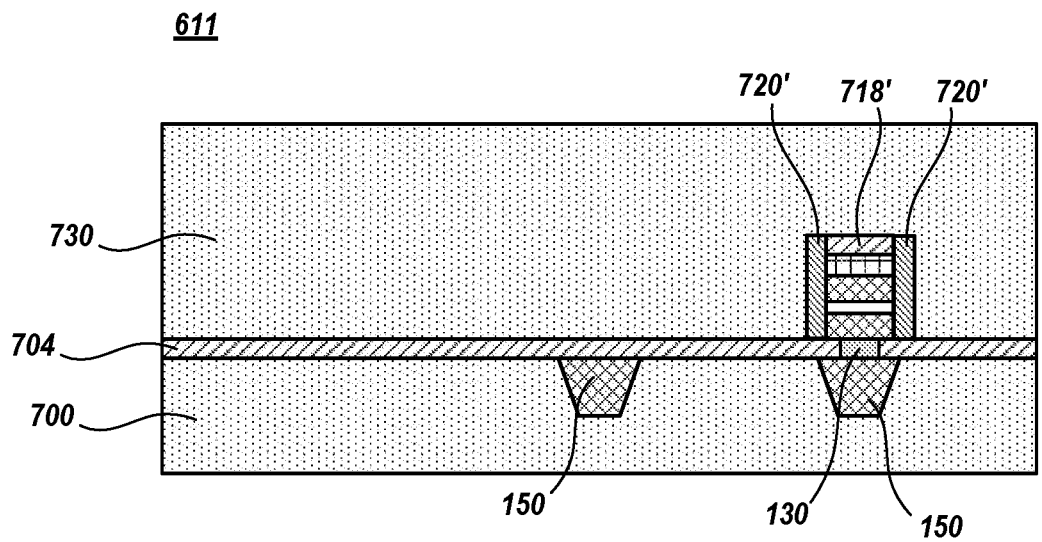

For clarity, in some implementations, stage 608 and stage 610 may be omitted if it is desired for ILD 730, shown for example in FIG. 12, to surround the cell stack 711.

FIG. 12 depicts a cross-sectional view of fabrication stage 611 of a fabrication method of forming an IC device that includes an NVM cell that includes TFR 112, in accordance with various embodiments of the present invention. At stage 611, ILD 730 is formed upon the heater layer 708 (if present) or upon the substrate 700 (if heater layer 708 is not present) and upon the retained encapsulation layer 720' portion(s) (if present) and upon the and cap 718'. If encapsulation spacers are not present, at stage 611, ILD 730 is formed upon the heater layer 708 (if present) or upon the substrate 700 (if heater layer 708 is not present) and upon and around the cell stack 711.

ILD 730 may be formed by depositing a blanket layer of dielectric material, such as a low-k dielectric material, upon the heating layer 704, substrate 700, retained encapsulation layer 720' portion(s), cap 718', as appropriate or desired. ILD 730 may be formed to a thickness generally greater than the height, or generally above, the upper surface of cap 718'.

In alternative implementations, ILD 730 may be formed to a thickness generally coplanar with the upper surface of cap 718'. In these implementations, a VIA (Vertical Interconnect Access) 746, exemplary shown in FIG. 14, may be formed through the ILD 730 to contact bottom wire 150 and another or second ILD layer may be formed upon the ILD 730 and upon the VIA 746. Subsequently, top wire 140 may be formed through the second ILD layer to contact the VIA 746 and top wire 140 may be formed through the second ILD layer to contact TFR 112, as is exemplary shown in FIG. 14.

Figure 13:
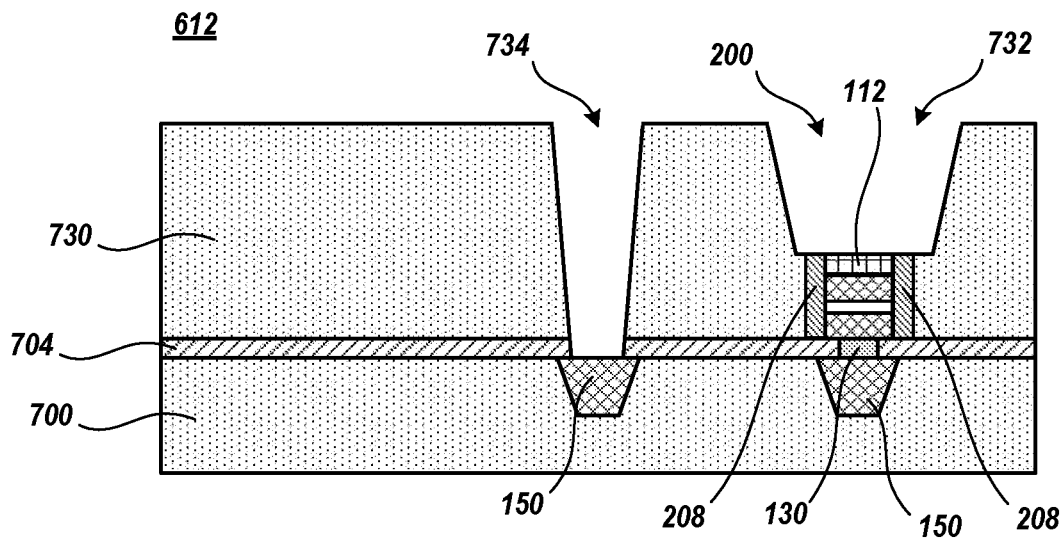

FIG. 13 depicts a cross-sectional view of fabrication stage 612 of a fabrication method of forming an IC device that includes an NVM cell that includes TFR 112, in accordance with various embodiments of the present invention. At stage 612, wiring trenches 732, 734 are formed within the ILD 730 utilizing the TFR 112 within cell stack 711 as an etch stop.

Wiring trench(es) 732, 734 may be formed by known selective removal techniques to remove undesired portions of ILD 730 generally above bottom wire 150 and/or generally above cell stack 711. Wiring trench(es) 734 generally exposes at least a portion of an underlying conductive structure, respectively. Wiring trench(es) 732 generally expose the upper surface of TFR 112 within the cell 711 and planarizes the top surface of encapsulation layer 720' portion(s) with the top surface of TFR 112, thereby forming encapsulation spacer(s) 108, 208, 308, 408, 508, or the like depending upon the NVM cell being fabricated.

In a preferred implementation, as depicted, wire trench 732 exposes the entire upper surface of the NVM cell (i.e. the top surface of encapsulation spacer(s) (if present) and the top surface of TFR 112).

Known etching techniques may be utilized to form wiring trenches with orthogonal type sidewall(s) (i.e. parallel to the sidewalls of the NVM cell) or to form wiring trenches with sloped type sidewalls(s), as depicted.

In accordance with embodiments of the present invention, the TFR 112 is utilized as the stop layer in which the etch, which forms wiring trench 732, stops. In this manner, the next higher (upper) level wiring trench 732 is formed utilizing an etch stop that is embedded or otherwise included in the NVM cell.

The etch technique utilized in stage 412 may be a physical or dry etch technique or a chemical wet etch. In a preferred implementation, the etch technique of stage 612 is a chemical wet etch and TFR 112 is configured as a wet etchant stop. Therefore, the TFR 112 may be configured to be a etch stop layer to different types of etches as desired.

Figure 14:
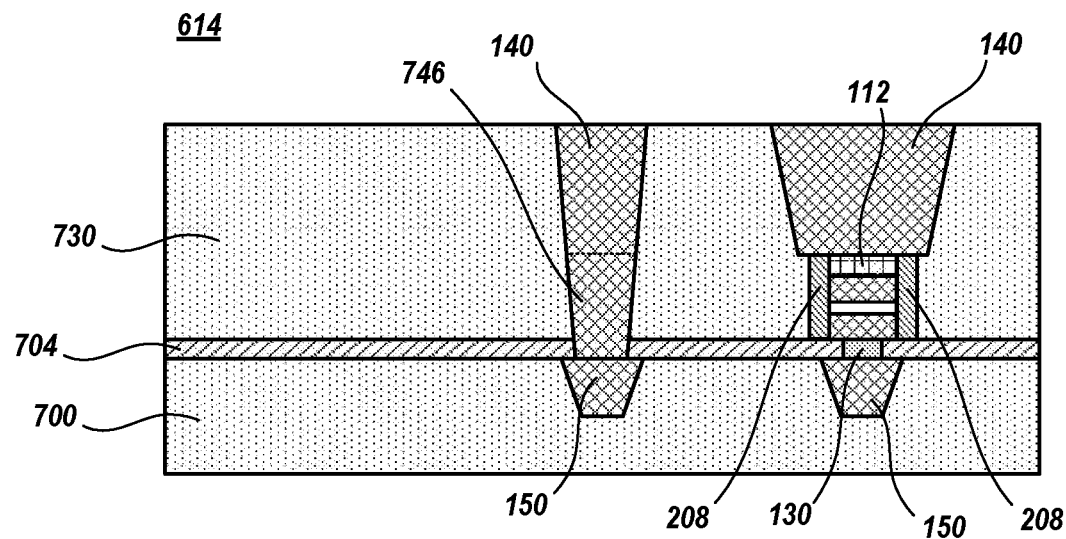

FIG. 14 depicts a cross-sectional view of fabrication stage 614 of a fabrication method of forming an IC device that includes an NVM cell that includes TFR 112, in accordance with various embodiments of the present invention. At stage 614, top wire 140 are formed within wiring trench(es) 732, 734, respectively. Top wire 140 may be formed by depositing electrically conductive material within wiring trench (es) 732, 734, respectively.

The top wire 140 may directly connect with TFR 112 of the NVM cell, as shown on the right wiring structure of FIG. 14. For example, wire 140 contacts the entire upper surface of TFR 112 and the entire upper surface of spacers 108, 208, 308, 408, 508, etc., depending upon the specific NVM cell fabricated. In some implementations, this top wire 140 contacts the entire upper surface of TFR 112 and further contacts at least a portion(s) of the upper surface(es) of the neighboring encapsulation spacer(s) 108, 208, 308, 408, 508, etc., respectively. Because The top wire 140 contacts or connects with TFR 112 of the NVM cell instead of directly contacting with the top state influencing electrode current entering the NVM cell from the top wire 150 is stepped down by the resistance of TFR 112 (which is tunable based upon the selection of the material of TFR 112). By limiting the electrical current entering the NVM cell with TFR 112, NVM cell endurance may be improved and adverse impacts to component(s) that neighbor the NVM cell may be limited.

Top wire 140 may be electrically connected to other components of the IC device by one or more electrical pathways within the IC device, as is known in the art. For example, one or more electrical pathways may connect top wire 140 with the memory controller, or the like. In this manner, components of the IC device may be electrically connected to the NVM cell fabricated.

In some implementations, it may be beneficial for NVM cells to be symmetrical across a horizontal bisector. As such, a second TFR 112 may be added to the lower portion of the cell between the bottom wire 150 and the bottom state influencing electrode. The term "bottom state influencing electrode" is defined herein to be a bottom electrically conductive electrode within the NVM cell in a location in the NVM cell reflected across the horizontal bisector of the NVM cell relative to the top state influencing electrode.

Figure 15:
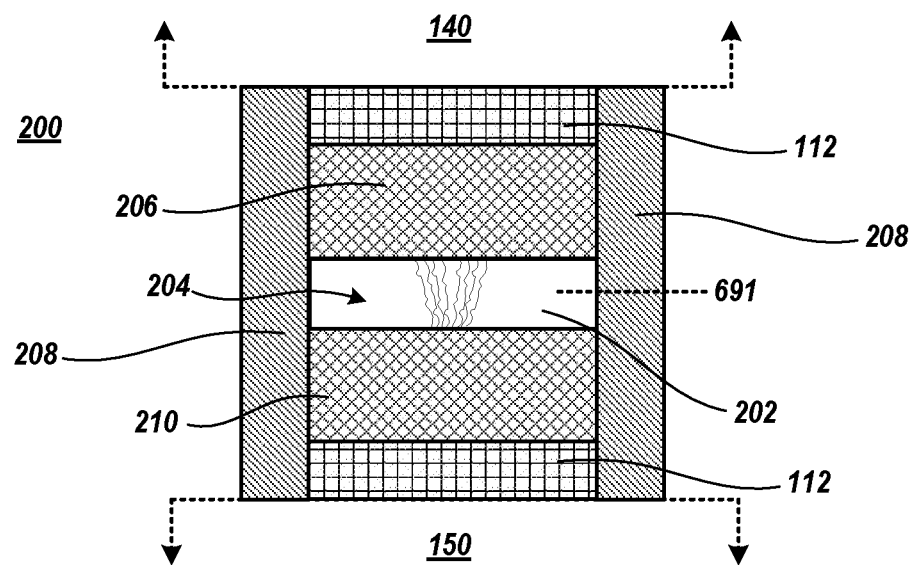
FIG. 15 depicts a cross section of a RRAM cell that includes an integrated thin film resistor and etch stop, in accordance with various embodiments of the present invention.

In FIG. 15, RRAM cell 200 includes a TFR 112 between the top electrode 206 and top wire 140 and between bottom electrode 210 and bottom wire 150, in accordance with various embodiments of the present invention. Bottom electrode 210 should be interpreted as the bottom state influencing electrode since it is the bottom electrically conductive electrode within the cell 400 in a location reflected across the horizontal bisector 691 relative to top electrode 406 (i.e. the top state influencing electrode). To fabricate such cell 400, in addition to those other fabrication stages contemplated herein, an additional etch stop TRF layer 716 may be formed between bottom electrode material layer 710 and heating layer 704 (if present) or between bottom electrode material layer 710 and substrate 700 (if heating layer 704 is not present).

Encapsulation spacer(s) 208 may be located upon or otherwise connected to the sidewall or side boundary of the cell layer sidewall(s) and the side boundary of the symmetrical top and bottom TFR 112 layers. An upper surface of the encapsulation spacer(s) 208 may be coplanar with the upper surface of the upper TFR 112 and a lower surface of the encapsulation spacer(s) 208 may be coplanar with the lower surface of the bottom TFR 112. The top wire 140 may be connected to the top surface of the TFR 112 and a bottom wire 150 may be connected to the bottom TFR 112.

Figure 16:
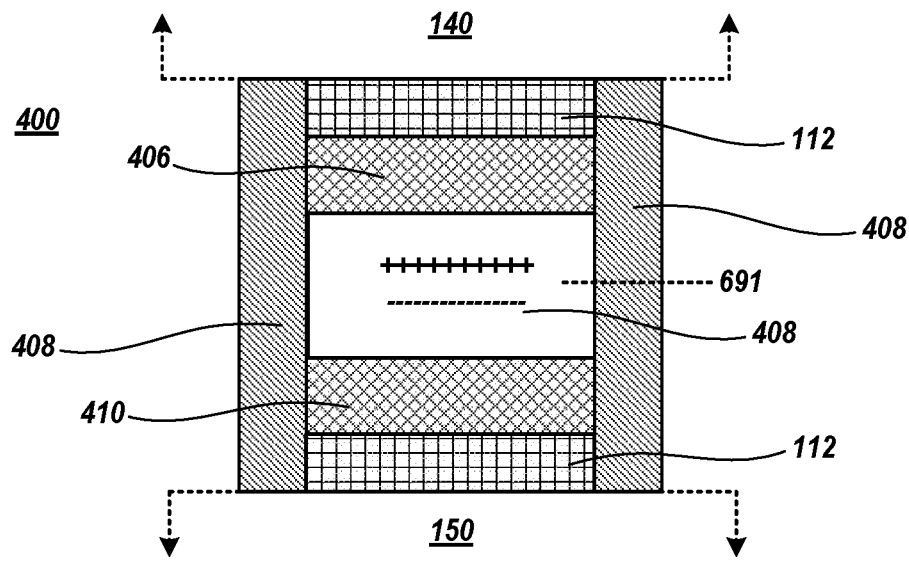
FIG. 16 depicts a cross section of a ferroelectric RAM (FRAM) cell that includes an integrated thin film resistor and etch stop, in accordance with various embodiments of the present invention.

In FIG. 16, FRAM cell 400 includes a TFR 112 between the top electrode 406 and top wire 140 and TRF 112 between bottom electrode 410 and bottom wire 150, in accordance with various embodiments of the present invention. Bottom electrode 410 should be interpreted as the bottom state influencing electrode since it is the bottom electrically conductive electrode within the cell 400 in a location reflected across the horizontal bisector 691 relative to top electrode 406 (i.e. the top state influencing electrode). To fabricate such cell 300, in addition to those other fabrication stages contemplated herein, an additional etch stop TRF layer 716 may be formed between bottom electrode material layer 710 and substrate 700.

Encapsulation spacer(s) 408 may be located upon or otherwise connected to the sidewall or side boundary of the cell layer sidewall(s) and the side boundary of the symmetrical top and bottom TFR 112 layers. An upper surface of the encapsulation spacer(s) 408 may be coplanar with the upper surface of the upper TFR 112 and a lower surface of the encapsulation spacer(s) 408 may be coplanar with the lower surface of the bottom TFR 112. The top wire 140 may be connected to the top surface of the TFR 112 and a bottom wire 150 may be connected to the bottom TFR 112.

Figure 17:
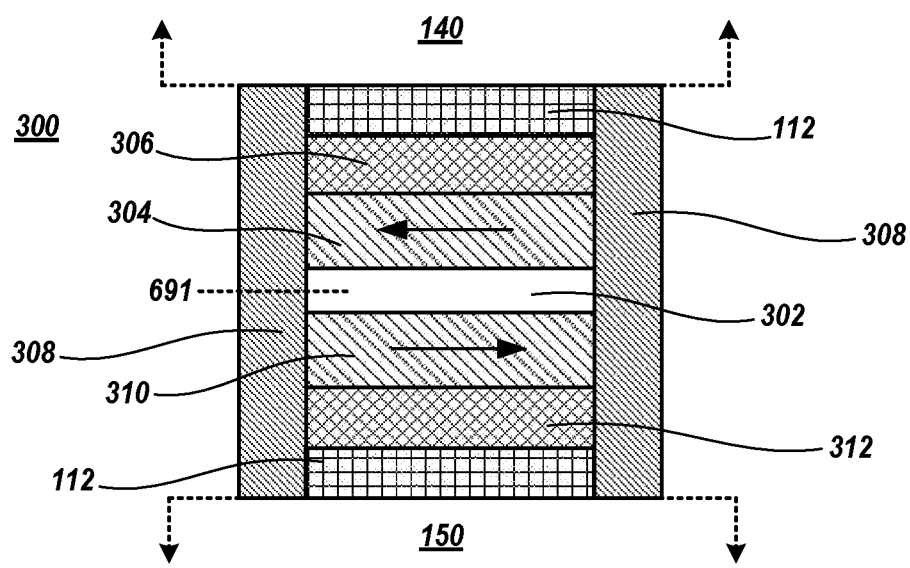
FIG. 17 depicts a cross section of a magnetoresistive random-access memory (MRAM) cell that includes an integrated thin film resistor and etch stop, in accordance with various embodiments of the present invention.

In FIG. 17, MRAM cell 300 includes a TFR 112 between the top electrode 206 and top wire 140 and between bottom electrode 312 and bottom wire 150, in accordance with various embodiments of the present invention. Bottom electrode 312 should be interpreted as the bottom state influencing electrode since it is the bottom electrically conductive electrode within the cell 300 in a location reflected across the horizontal bisector 691 relative to top electrode 306 (i.e. the top state influencing electrode). To fabricate such cell 300, in addition to those other fabrication stages contemplated herein, an additional etch stop TRF layer 716 may be formed between bottom electrode material layer 710 and substrate 700.

Encapsulation spacer(s) 308 may be located upon or otherwise connected to the sidewall or side boundary of the cell layer sidewall(s) and the side boundary of the symmetrical top and bottom TFR 112 layers. An upper surface of the encapsulation spacer(s) 308 may be coplanar with the upper surface of the upper TFR 112 and a lower surface of the encapsulation spacer(s) 308 may be coplanar with the lower surface of the bottom TFR 112. The top wire 140 may be connected to the top surface of the TFR 112 and a bottom wire 150 may be connected to the bottom TFR 112.

Figure 18:
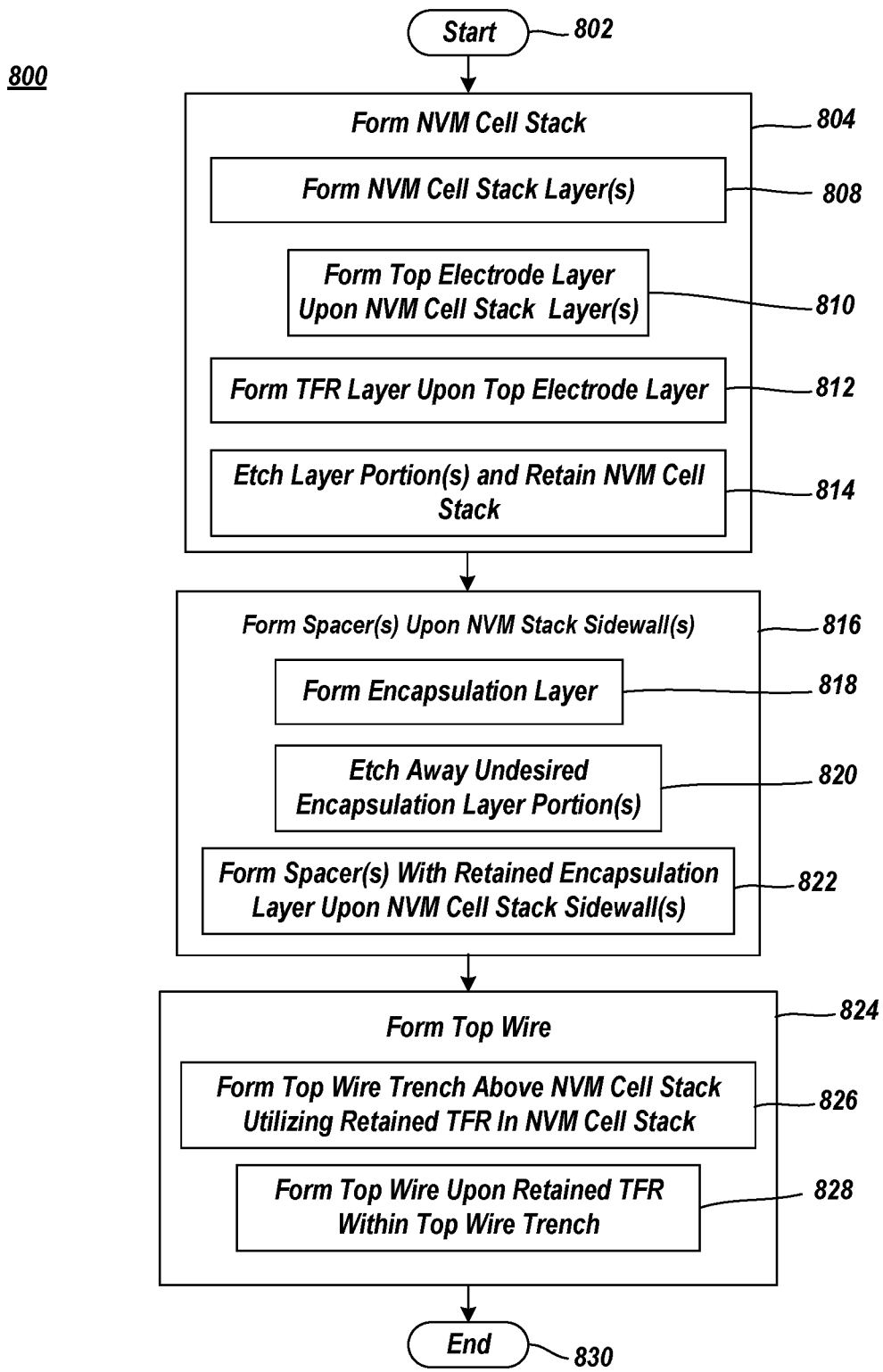
FIG. 18 depicts an integrated circuit (IC) device fabrication method that includes a non-volatile memory cell that includes an integrated thin film resistor and etch stop, in accordance with various embodiments of the present invention.

FIG. 18 depicts an integrated circuit (IC) device fabrication method 800, in accordance with various embodiments of the present invention. Method 800 may be utilized to form an IC device, such as a processor, microprocessor, memory, FPGA, or the like, that includes at least one NVM memory cell that includes TRF 112 between the top state influencing electrode and top wire 140.

Method 800 begins at block 802 and continues with forming an NVM cell stack (block 804). For example, an NVM cell stack 711 is formed upon a substrate 700 or formed upon heating layer 704/bottom electrode 130, as appropriate, depending upon the type of NVM cell fabricated.

In PCRAM 100 embodiments, the cell stack 711 may be formed by forming the volume of PCM 102 upon heating layer 704/bottom electrode 130, by forming top electrode 106 upon the PCM 102 volume, and by forming TFR 112 upon the top electrode 106. In some embodiments, the cell stack 711 may be further formed by forming cap 718' upon TFR 112.

In RRAM 200 embodiments, the cell stack 711 may be formed by forming bottom electrode 210 upon heating layer 704/bottom electrode 130, by forming insulator 204 upon the bottom electrode 210, by forming top electrode 206 upon the insulator 204, and by forming TFR 112 upon the top electrode 206. In some embodiments, the cell stack 711 may be further formed by forming cap 718' upon TFR 112.

In MRAM cell 300 embodiments, the cell stack 711 may be formed by forming bottom electrode 210 upon substrate 704 and/or bottom wire 150, by forming bottom ferromagnetic fixed layer 310 upon the bottom electrode 210, by forming barrier layer 302 upon bottom ferromagnetic fixed layer 310, by forming top ferromagnetic free layer 304 upon barrier layer 302, by forming top electrode 306 upon the top ferromagnetic free layer 304, and by forming TFR 112 upon the top electrode 306. In some embodiments, the cell stack 711 may be further formed by forming cap 718' upon TFR 112.

In FRAM cell 400 embodiments, the cell stack 711 may be formed by forming bottom electrode 410 upon substrate 704 and/or bottom wire 150, by forming ferroelectric dielectric layer 408 upon bottom electrode 410, by forming top electrode 406 upon ferroelectric dielectric layer 408, and by forming TFR 112 upon top electrode 406. In some embodiments, the cell stack 711 may be further formed by forming cap 718' upon TFR 112.

In ECRAM cell 500 embodiments, the cell stack 711 may be formed by forming bottom electrode 510 upon the substrate 704 and upon bottom wire 150, by forming mixed ionic electronic conductor 512 upon the bottom electrode 510, by forming barrier 520 upon mixed ionic electronic conductor 512, by forming mixed ionic electronic conductor 514 upon barrier 520, by forming top electrode 506 upon forming mixed ionic electronic conductor 514, and by forming TFR 112 formed upon the top electrode 506. In some embodiments, the cell stack 711 may be further formed by forming cap 718' upon TFR 112.

In some implementations, the cell stack 711 may be formed by forming NVM cell stack layer(s) (block 808), by forming a top electrode layer upon the cell stack layer(s) (block 810), and by forming a TFR layer upon the top electrode layer (block 812). For example, In PCRAM cell 100 embodiments, the cell stack 711 layers may be formed by forming a phase change material layer upon the heating layer 704, by forming top electrode material layer upon the heating layer, by forming etch stop TRF layer 716 upon the top electrode material layer, and by forming capping layer 718 upon the etch stop TRF layer 716.

In RRAM 200 embodiments, the cell stack 711 may be formed by forming bottom electrode material layer 710 upon heating layer 704, by forming insulator material layer 712 upon bottom electrode material layer 710, by forming top electrode material layer 714 upon insulator material layer 712, by forming etch stop TRF layer 716 upon top electrode material layer 714, and by forming capping layer 718 upon etch stop TRF layer 716.

In MRAM cell 300 embodiments, the cell stack 711 may be formed by forming bottom electrode material layer, by forming ferromagnetic fixed material layer upon the bottom electrode material layer, by forming barrier material layer upon the ferromagnetic fixed material layer, by forming top ferromagnetic free layer upon the barrier material layer, by forming top electrode material layer upon the top ferromagnetic free layer, by forming etch stop TRF layer 716 upon the top electrode material layer, and by forming capping layer 718.

In FRAM cell 400 embodiments, the cell stack 711 may be formed by forming a bottom electrode material layer, by forming a ferroelectric dielectric material layer upon the bottom electrode material layer, by forming top electrode material layer upon the ferroelectric dielectric material layer, by forming etch stop TRF layer 716 upon the top electrode material layer, and by forming capping layer 718 upon etch stop TRF layer 716.

In ECRAM cell 500 embodiments, the cell stack 711 may be formed by forming a bottom electrode material layer upon the substrate and upon a first bottom wire, by depositing mixed ionic electronic conductor material layer upon the bottom electrode material layer, by depositing barrier material upon the mixed ionic electronic conductor material layer, by depositing mixed ionic electronic conductor material layer upon the barrier layer, by depositing to electrode material layer upon the mixed ionic electronic conductor material layer, by depositing a etch stop TFR layer 716 upon the gate electrode material layer, and by depositing a capping layer 718 upon the etch stop TFR layer 716.

In some implementations, the cell stack 711 may be further formed by etching away undesired NVM cell stack layer portions and retaining the desired NVM cell stack layer portions to form the NVM cell stack (block 814). For example, in PCRAM cell 100 embodiments, the cell stack 711 may be formed by retaining the volume of PCM 102 and removing the undesired phase change material layer portions, retaining the top electrode 106 and removing undesired top electrode material layer portions, retaining TFR 112 and removing undesired etch stop TRF layer 716 portions, and/or retaining cap 718' and removing undesired capping layer 718 portions.

In RRAM cell 200 embodiments, the cell stack 711 may be formed by retaining bottom electrode 210 and removing undesired bottom electrode material layer 710 portions, by retaining insulator material 202 and removing undesired insulator material layer 712 portions, by retaining top electrode 206 and removing undesired top electrode material layer 714 portions, by retaining TFR 112 and removing undesired etch stop TRF layer 716 portions, and retaining cap 718' and removing undesired capping layer 718 portions.

In MRAM cell 300 embodiments, the cell stack 711 may be formed by retaining bottom electrode 312 and removing undesired bottom electrode layer material portions, by retaining ferromagnetic fixed layer 310 and removing undesired ferromagnetic fixed material layer portions, by retaining the barrier layer 302 and removing undesired barrier material layer portions, by retaining top ferromagnetic free layer 304 and removing undesired top ferromagnetic free layer portions, by retaining TFR 112 and removing undesired etch stop TRF layer 716 portions, and retaining cap 718' and removing undesired capping layer 718 portions.

In FRAM cell 400 embodiments, the cell stack 711 may be formed by retaining bottom electrode 410 and removing undesired bottom electrode material layer portions, by retaining ferroelectric dielectric layer 408 and removing undesired ferroelectric dielectric material layer portions, by retaining top electrode 406 and removing top electrode material layer portions, by retaining TFR 112 and removing undesired etch stop TRF layer 716 portions, and retaining cap 718' and removing undesired capping layer 718 portions.

In ECRAM cell 500 embodiments, the cell stack 711 may be formed by retaining bottom electrode 510 and removing undesired bottom electrode material layer portions, by retaining mixed ionic electronic conductor 512 and removing undesired portions of the mixed ionic electronic conductor material layer, by retaining barrier 520 and removing undesired portions of the barrier material layer, by retaining mixed ionic electronic conductor 514 and removing undesired portions of the mixed ionic electronic conductor material layer, by retaining top electrode 506 and removing undesired portions of the top electrode material layer, by retaining TFR 112 and removing undesired portions of the etch stop TRF layer 716, and by retaining cap 718' and removing undesired portions of the capping layer 718.

In CBRAM cell 900 embodiments, the cell stack 711 may be formed by retaining bottom electrode 910 and removing undesired bottom electrode material layer 710 portions, by retaining solid state electrolyte 902 and removing undesired solid state electrolyte layer portions, by retaining top electrode 906 and removing undesired top electrode material layer 714 portions, by retaining TFR 112 and removing undesired etch stop TRF layer 716 portions, and retaining cap 718' and removing undesired capping layer 718 portions.

Method 800 may continue with forming encapsulation spacer(s) upon the NVM stack sidewall(s) (block 816). For example, encapsulation spacer(s) 108, 208, 308, 408, 508, or the like are formed upon the sidewall(s) of the NVM stack 711. The encapsulation spacer(s) may be formed by forming an encapsulation layer upon the substrate 700 or heating layer 704, as appropriate, and forming the encapsulation layer around the NVM stack (block 818).

The encapsulation spacer(s) may be further formed by removing undesired portion(s) of the encapsulation layer (block 820). For example, undesired encapsulation layer portion(s) are etched away by a chemical or physical etch. The desired or retained encapsulation layer portion(s) effectively form the encapsulation spacer(s) 108, 208, 308, 408, 508, or the like and are located upon the sidewall(s) or side surface(s) of the NVM stack (block 822).

Method 800 may continue with forming a top wire upon the TFR 112 and/or upon the encapsulation spacer(s) (block 582428). For example, a top wire 140 is formed within an ILD 730 that is formed above the upper surface of the TFR 112 and above the upper surface of encapsulation spacer(s). A wire trench 732 may be formed within the ILD 730 utling the top surface of the TFR 112 as an etch stop (block 826) thereby exposing the upper surface of the TFR 112 and exposing at least a portion of the upper surface of spacer(s) 108, 208, 308, 408, 508, or the like. The top wire 150 may be formed by depositing conductive material within the wire trench 732 such that the conductive material contacts the upper surface of the TFR 112 and contacts the at least the portion of the spacer(s) (block 828). A chemical mechanical polish may be utilized to planarize the top surface of the top wire 140 and the top surface of ILD 730. Method 800 may end at block 830.

Figure 19:
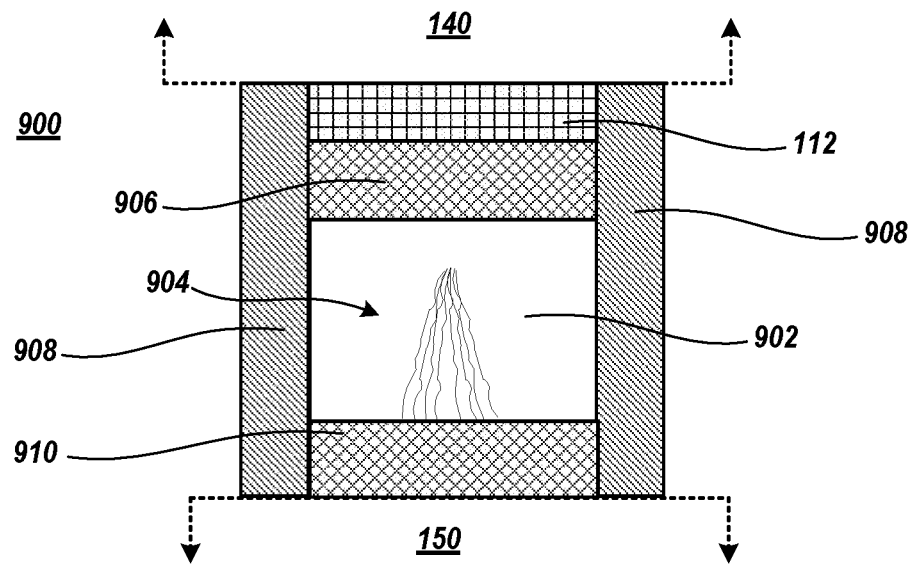
FIG. 19 and FIG. 20 depicts a cross section of a conductive bridge RAM (CBRAM) cell that includes an integrated thin film resistor and etch stop, in accordance with various embodiments of the present invention.

FIG. 19 depicts a cross section of a CBRAM cell 900 that includes TFR 112, in accordance with various embodiments of the present invention.

CBRAM is a non-volatile solid-state memory technology that exploits reversible conductive filament (CF) growth between metal plates, thus taking the device to a low-resistance. The fundamental storage unit (the "cell") can be programmed into a number of different states, or levels, which exhibit different resistance characteristics. The programmable cell-states can be used to represent different data values, permitting storage of information.

The CBRAM cell may include a top electrode (anode) that is a sacrificial metal layer, such as Copper, Silver, or the like. The cell further includes a thin film of solid-state electrolyte, such as GeS2, AlOx, GdOx, MOx, etc., that forms the insulator layer sandwiched between the top and bottom electrodes. The bottom electrode (cathode) is made up of inert metals, such as Tungsten, Platinum, or the like.

In single-level CBRAM devices, each cell can be set to one of s=2 states, a LRS and a HRS, permitting storage of one bit per cell. When a voltage of specific polarity is applied across the device, ions of the sacrificial active metal diffuse through the electrolyte, and get reduced at the cathode. This leads to the formation of the conductive filament (CF) that connects the top and bottom electrodes, thus taking the device to LRS or on-state. When the voltage of opposite polarity is applied the CF dissolves bringing the device back to the HRS or off-state. The different states (LRS/HRS) denote the bit stored in the cell (1 or 0).

Reading and writing of data in PCM cells is achieved by applying appropriate voltages to the cell. In a write operation, the resulting programming signal causes either CF formation or not to induce the desired cell-state. Reading of CBRAM cells is performed using cell resistance as a metric for cell-state. An applied read voltage causes a current to flow through the cell, this read current being dependent on resistance of the cell. Measurement of the cell read current therefore provides an indication of the programmed cell state. A sufficiently low read voltage is used for this resistance metric to ensure that application of the read voltage does not disturb the programmed cell state. Cell state detection can then be performed by comparing the resistance metric with predefined reference levels for the programmable cell-states.

CBRAM cell 900 includes solid-state electrolyte 902 located between a top electrode 906 and a bottom electrode 910. The cell state shown represents an intermediate state in which CFs 904 are forming within the insulator 902. When a read voltage is applied to read the programmed cell-state, the resulting read current flows primarily via the current path between top electrode 906 to/from bottom electrode 910 through the CF 904, in preference to flowing through the solid-state electrolyte 902 in which the CFs 904 have not formed.

CBRAM cell 900 also includes TFR 112 located upon the top surface of the top electrode 906. TFR 112 may mitigate voltage flux imparted by relaxing ions. In ECRAM, after programing the cell 500, ions may relax back over the barrier 520 and the cell 500 resulting holds some voltage. In some applications, the TFR 112 may mitigates this effect of the ions relaxing back over the barrier 520. In addition, should a cell 500 form a short across the barrier 520, the TFR 112 provide a base resistance value to, for example, identification for dropping from a neural net. Further, in some implementations, the conductivity of top electrode 906 may be too high to drive optimal or desired state changing behavior within the solid-state electrolyte 902, TFR 122 acts as a current step down that limits or generally reduces the electrical current from the top electrode 906 through the solid-state electrolyte 902. TFR 122 may serve as a ballast resistor upon when the CF 904 of the CBRAM cell 900 is formed. As soon as a CF 904 connection is made between electrodes, the current at a given voltage jumps up and the TFR 122 acts as a ballast resistor through the cell 900. By such limiting the electrical current through the insulator 904 with the TFR 112, CBRAM cell 900 endurance may be improved and adverse impacts to component(s) that neighbor the CBRAM cell 900 may be limited.

Encapsulation spacer(s) 908 may be located upon or otherwise connected to the sidewall or side boundary of the MIM stack and the sidewall of the side boundary of TFR 112. An upper surface of the encapsulation spacer(s) 908 may be coplanar with the upper surface of the TFR 112 and a lower surface of the encapsulation spacer(s) 908 may be coplanar with the lower surface of the bottom electrode 910.

In some implementations, encapsulation spacer(s) 908 may be omitted and ILD 730, shown for example in FIG. 10, may be formed in place thereof (i.e., ILD 730 may contact the sidewall or side boundary of the MIM stack and contact the sidewall of the side boundary of TFR 112).

A top wire 140 may be connected to the top surface of the TFR 112 and a bottom wire 150 may be connected to the bottom electrode 910. The top wire 140 and/or the bottom wire 150 may be electrically connected to other components in the IC device, such as a memory controller, or the like, as is known in the art.

Figure 20:
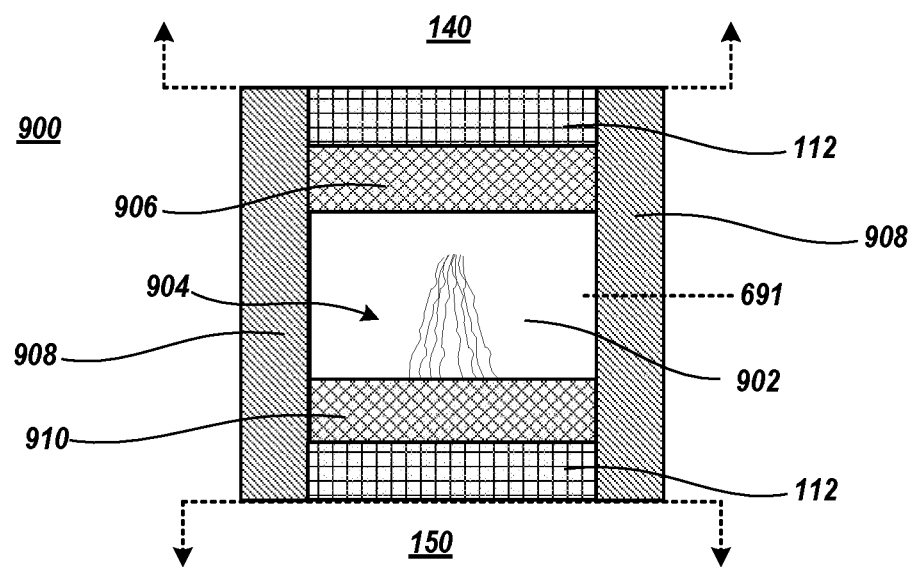

In FIG. 20, CBRAM cell 900 includes a TFR 112 between the top electrode 906 and top wire 140 and between bottom electrode 910 and bottom wire 150, in accordance with various embodiments of the present invention. Bottom electrode 910 should be interpreted as the bottom state influencing electrode since it is the bottom electrically conductive electrode within the cell 900 in a location reflected across the horizontal bisector 691 relative to top electrode 906 (i.e. the top state influencing electrode). To fabricate such cell 900, in addition to those other fabrication stages contemplated herein, an additional etch stop TRF layer 716 may be formed between bottom electrode 910 material layer and heating layer 704 (if present) or between bottom electrode 910 material layer and substrate 700 (if heating layer 704 is not present).

Encapsulation spacer(s) 908 may be located upon or otherwise connected to the sidewall or side boundary of the cell layer sidewall(s) and the side boundary of the symmetrical top and bottom TFR 112 layers. An upper surface of the encapsulation spacer(s) 908 may be coplanar with the upper surface of the upper TFR 112 and a lower surface of the encapsulation spacer(s) 908 may be coplanar with the lower surface of the bottom TFR 112. The top wire 140 may be connected to the top surface of the TFR 112 and a bottom wire 150 may be connected to the bottom TFR 112.

Figure 21:
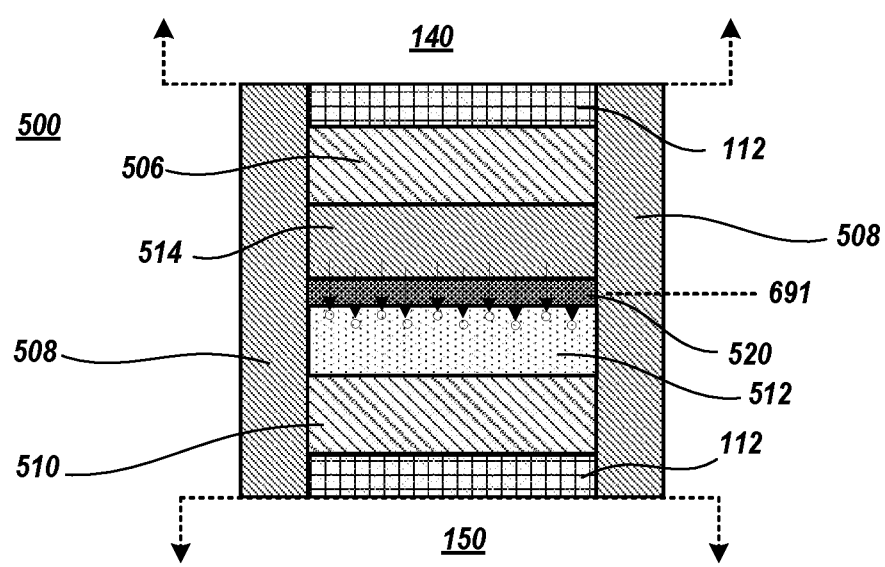
FIG. 21 depicts a cross section of an electrochemical RAM (ECRAM) cell that includes an integrated thin film resistor and etch stop, in accordance with various embodiments of the present invention.

In FIG. 21, ECRAM cell 500 includes a TFR 112 between the top electrode 506 and top wire 140 and between bottom electrode 510 and bottom wire 150, in accordance with various embodiments of the present invention. Bottom electrode 510 should be interpreted as the bottom state influencing electrode since it is the bottom electrically conductive electrode within the cell 500 in a location reflected across the horizontal bisector 691 relative to top electrode 506 (i.e. the top state influencing electrode). To fabricate such cell 500, in addition to those other fabrication stages contemplated herein, an additional etch stop TRF layer 716 may be formed between bottom electrode 510 material layer and substrate 700.

Encapsulation spacer(s) 508 may be located upon or otherwise connected to the sidewall or side boundary of the cell layer sidewall(s) and the side boundary of the symmetrical top and bottom TFR 112 layers. An upper surface of the encapsulation spacer(s) 508 may be coplanar with the upper surface of the upper TFR 112 and a lower surface of the encapsulation spacer(s) 508 may be coplanar with the lower surface of the bottom TFR 112. The top wire 140 may be connected to the top surface of the top TFR 112 and a bottom wire 150 may be connected to the bottom surface of the bottom TFR 112.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

For clarity, a top surface of the various encapsulation spacer(s) contemplated herein need not be coplanar with the top surface of the top TFR 112. In alternative implementations, the top surface of the various encapsulation spacer(s) may be coplanar with the bottom surface of the top TFR 112, may be between the top surface of the top state influencing electrode and the bottom surface of the top state influencing electrode, or the like. Generally, the top surface of the encapsulation spacer(s) contemplated herein may be above the top surface of the uppermost state changing structure and the bottom surface of the encapsulation spacer(s) contemplated herein may be below the bottom surface of the lowermost state changing structure within the cells.

Unless described otherwise or in addition to that described herein, "deposit," "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

References herein to terms such as "vertical", "horizontal", etc. are made by way of example, and not by way of limitation, to establish a frame of reference. The term "horizontal" as used herein is defined as a plane parallel to the conventional plane or surface of the substrate 700, regardless of the actual spatial orientation of the substrate 700. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

What is claimed is:

1. A non-volatile memory (NVM) comprising:
   a NVM cell comprising a top state influencing electrode in contact with a state changing structure; the top state influencing electrode changes a detectable property of the state changing structure, the detectable property of the stage changing structure represents a data value, a bottom electrode in contact with the state changing structure, a first thin film resistor (TFR) above and in contact with the top state influencing electrode, and a second TFR below and in contact with the bottom electrode, the NVM cell symmetrical across a horizontal bisector; and
   a top wire above and in contact with a top surface of the first TFR, wherein the NVM cell is inset relative to sloped sidewalls of the top wire.

2. The NVM of claim 1, wherein the first TFR electrically serially connects the top wire and the top state influencing electrode.

3. The NVM of claim 1, further comprising:
   an encapsulation spacer upon and around vertical sidewalls of the NVM cell.

4. The NVM of claim 3, wherein the top wire is further connected to the encapsulation spacer, the encapsulation spacer inset relative to sloped sidewalls of the top wire.

5. The NVM of claim 1, wherein the first TFR reduces electrical current from the top wire to the top state influencing electrode.

6. The NVM of claim 3, wherein the sidewall of the state changing structure, the sidewall of the top state influencing electrode, and the sidewall of the first TFR are coplanar.

7. The NVM of claim 1, further comprising:
   a bottom wire below and in contact with a bottom surface of the second TFR.

8. The NVM of claim 7, wherein the second TFR reduces electrical current from the bottom state influencing electrode to the bottom wire.

9. An integrated circuit (IC) device fabrication method comprising:
   forming a bottom state influencing electrode above and in-line with a bottom wire;
   forming a state changing structure upon the bottom state influencing electrode;
   forming a top state influencing electrode directly upon the state changing structure; the top state influencing electrode changes a detectable property of the state changing structure, the detectable property of the stage changing structure represents a data value;
   forming a thin film resistor (TFR) directly upon the top state influencing electrode;
   forming an encapsulation spacer upon at least a sidewall of the state changing structure, upon a sidewall of the top state influencing electrode, and upon a sidewall of the TFR; and
   forming a top wire upon a top surface of the TFR, wherein the TFR electrically serially connects the top wire and the top state influencing electrode, wherein the encapsulation spacer is inset relative to sloped sidewalls of the top wire.

10. The IC device fabrication method of claim 9, further comprising:
    forming a cap directly upon the TFR.

11. The IC device fabrication method of claim 10, further comprising:
    forming a blanket inter-layer dielectric (ILD) layer comprising a top surface above a top surface of the cap.

12. The IC device fabrication method of claim 11, further comprising:
    etching a top wire trench within the ILD utilizing the TFR as an etch stop, the etch removing the cap, removing a portion of the encapsulation spacer, thereby planarizing the top surface of the TFR and a top surface of the encapsulation spacer, the etch further exposing the top surface of the TFR.

13. An integrated circuit (IC) device fabrication method comprising:
    forming a bottom thin film resistor (TFR) directly upon a bottom wire;
    forming a bottom state influencing electrode in-line with the bottom wire and directly upon the TFR, wherein the bottom TFR electrically serially connects the bottom wire and the bottom state influencing electrode;
    forming a state changing structure upon the bottom state influencing electrode;
    forming a top state influencing electrode directly upon the state changing structure; the top state influencing electrode changes a detectable property of the state changing structure, the detectable property of the stage changing structure represents a data value;

forming a top TFR directly upon the top state influencing electrode, wherein the top TFR is symmetrical to the bottom TFR across a horizontal bisector of the state changing structure and wherein the top state influencing electrode is symmetrical to the bottom state influencing electrode across the horizontal bisector of the state changing structure;

forming an encapsulation spacer upon at least a sidewall of the state changing structure, upon a sidewall of the top state influencing electrode, upon a sidewall of the top TFR, upon a sidewall of the bottom state influencing electrode, and upon a sidewall of the bottom TFR; and forming a top wire upon a top surface of the top TFR, wherein the top TFR electrically serially connects the top wire and the top state influencing electrode, wherein the encapsulation spacer is inset relative to sloped sidewalls of the top wire.

14. The IC device fabrication method of claim 13, further comprising:

forming a cap directly upon the top TFR.

15. The IC device fabrication method of claim 14, further comprising:

forming a blanket inter-layer dielectric (ILD) layer comprising a top surface above a top surface of the cap.

16. The IC device fabrication method of claim 15, further comprising:

etching a top wire trench within the ILD utilizing the top TFR as an etch stop, the etch removing the cap, removing a portion of the encapsulation spacer, thereby planarizing the top surface of the top TFR and a top surface of the encapsulation spacer, the etch further exposing the top surface of the top TFR.

* * * * *